US011955547B2

(12) United States Patent
Pan et al.

(10) Patent No.: US 11,955,547 B2
(45) Date of Patent: Apr. 9, 2024

(54) SEMICONDUCTOR DEVICE INCLUDING AN EPITAXY REGION

(71) Applicant: Taiwan Semiconductor Manufacturing Company, Ltd., Hsin-Chu (TW)

(72) Inventors: Te-Jen Pan, Hsinchu (TW); Yu-Hsien Lin, Hsinchu (TW); Hsiang-Ku Shen, Hsinchu (TW); Wei-Han Fan, Hsin-Chu (TW); Yun Jing Lin, Hsinchu (TW); Yimin Huang, Hsinchu (TW); Tzu-Chung Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/227,107

(22) Filed: Dec. 20, 2018

(65) Prior Publication Data

US 2019/0123198 A1   Apr. 25, 2019

Related U.S. Application Data

(62) Division of application No. 15/457,613, filed on Mar. 13, 2017, now Pat. No. 10,164,093, which is a (Continued)

(51) Int. Cl.
*H01L 29/78* (2006.01)
*H01L 21/8238* (2006.01)
(Continued)

(52) U.S. Cl.
CPC .. *H01L 29/7833* (2013.01); *H01L 21/823807* (2013.01); *H01L 21/823814* (2013.01);
(Continued)

(58) Field of Classification Search
CPC ..... H01L 21/823807; H01L 21/823814; H01L 21/823864; H01L 21/823871;
(Continued)

(56) References Cited

U.S. PATENT DOCUMENTS 6,040,223 A   3/2000 Liu et al.
2002/0137293 A1* 9/2002 Chen ................ H01L 29/66628
438/585

(Continued)

*Primary Examiner* — Vongsavanh Sengdara
(74) *Attorney, Agent, or Firm* — HAYNES AND BOONE, LLP

(57) ABSTRACT

An integrated circuit device includes a gate stack disposed over a substrate. A first L-shaped spacer is disposed along a first sidewall of the gate stack and a second L-shaped spacer is disposed along a second sidewall of the gate stack. The first L-shaped spacer and the second L-shaped spacer include silicon and carbon. A first source/drain epitaxy region and a second source/drain epitaxy region are disposed over the substrate. The gate stack is disposed between the first source/drain epitaxy region and the second source/drain epitaxy region. An interlevel dielectric (ILD) layer disposed over the substrate. The ILD layer is disposed between the first source/drain epitaxy region and a portion of the first L-shaped spacer disposed along the first sidewall of the gate stack and between the second source/drain epitaxy region and a portion of the second L-shaped spacer disposed along the second sidewall of the gate stack.

20 Claims, 17 Drawing Sheets

Related U.S. Application Data division of application No. 13/010,028, filed on Jan. 20, 2011, now Pat. No. 9,595,477.

(51) Int. Cl.
*H01L 29/04* (2006.01)
*H01L 29/06* (2006.01)
*H01L 29/165* (2006.01)
*H01L 29/66* (2006.01)

(52) U.S. Cl.
CPC ........... *H01L 21/823828* (2013.01); *H01L 21/823864* (2013.01); *H01L 21/823871* (2013.01); *H01L 29/04* (2013.01); *H01L 29/0649* (2013.01); *H01L 29/165* (2013.01); *H01L 29/6653* (2013.01); *H01L 29/66545* (2013.01); *H01L 29/6656* (2013.01); *H01L 29/6659* (2013.01); *H01L 29/66628* (2013.01); *H01L 29/66636* (2013.01); *H01L 29/7834* (2013.01); *H01L 29/7848* (2013.01)

(58) Field of Classification Search
CPC ........... H01L 29/6656; H01L 29/66545; H01L 29/6659; H01L 29/7833; H01L 29/7834; H01L 29/04; H01L 29/6653; H01L 29/0649; H01L 29/7848; H01L 29/66628; H01L 29/66636; H01L 29/165; H01L 21/823828

See application file for complete search history.

(56) References Cited

U.S. PATENT DOCUMENTS

| | | |
|---|---|---|
| 2004/0077136 A1 | 4/2004 | Ma et al. |
| 2004/0137672 A1 | 7/2004 | Lee et al. |
| 2004/0259303 A1 | 12/2004 | Lee et al. |
| 2005/0112817 A1* | 5/2005 | Cheng ................ H01L 29/6656 257/374 |
| 2005/0142784 A1* | 6/2005 | Kim .................... H01L 29/6656 438/303 |
| 2006/0157797 A1* | 7/2006 | Tateshita ........... H01L 29/66628 257/E29.085 |
| 2006/0166422 A1 | 7/2006 | Suenaga |
| 2007/0018205 A1* | 1/2007 | Chidambarrao ........................... H01L 21/823807 438/296 |
| 2007/0102776 A1 | 5/2007 | Pan et al. |
| 2007/0128786 A1 | 6/2007 | Cheng et al. |
| 2008/0081406 A1* | 4/2008 | Choo ............... H01L 21/823814 257/E21.633 |
| 2008/0258233 A1 | 10/2008 | Hsiao et al. |
| 2009/0039426 A1* | 2/2009 | Cartier .............. H01L 21/28079 257/344 |
| 2010/0062592 A1 | 3/2010 | Clark |
| 2010/0252810 A1 | 10/2010 | Fuller et al. |
| 2011/0042758 A1* | 2/2011 | Kikuchi .............. H01L 29/165 257/E21.615 |
| 2011/0254090 A1* | 10/2011 | Cheng ............... H01L 29/78618 438/151 |
| 2012/0104470 A1* | 5/2012 | Ponoth ............. H01L 29/66553 257/288 |
| 2012/0139042 A1 | 6/2012 | Fu et al. |

\* cited by examiner

SEMICONDUCTOR DEVICE INCLUDING AN EPITAXY REGION

This application is a divisional application of U.S. patent application Ser. No. 15/457,613, filed Mar. 13, 2017, now U.S. Pat. No. 10,164,093, which is a divisional of U.S. patent application Ser. No. 13/010,028, filed Jan. 20, 2011, now U.S. Pat. No. 9,595,477, both of which are herein incorporated by reference in their entirety.

BACKGROUND

The semiconductor industry has progressed into smaller technology node processes in pursuit of higher device density, higher performance, and lower costs. One process for improved device performance includes creating an epitaxy region for the source/drain for enhanced transistor device performance. The epitaxy region provides a strained region that enhances carrier mobility.

Issues may arise from the process of growing the epitaxy regions however. These issues include growth of unwanted epitaxial material on other regions of the device. For example, exposure of a sidewall of a gate stack may lead to undesirable epitaxial growth on the gate stack. This growth may be characterized as a "mushroom" on account of its shape.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over, on, or abutting a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
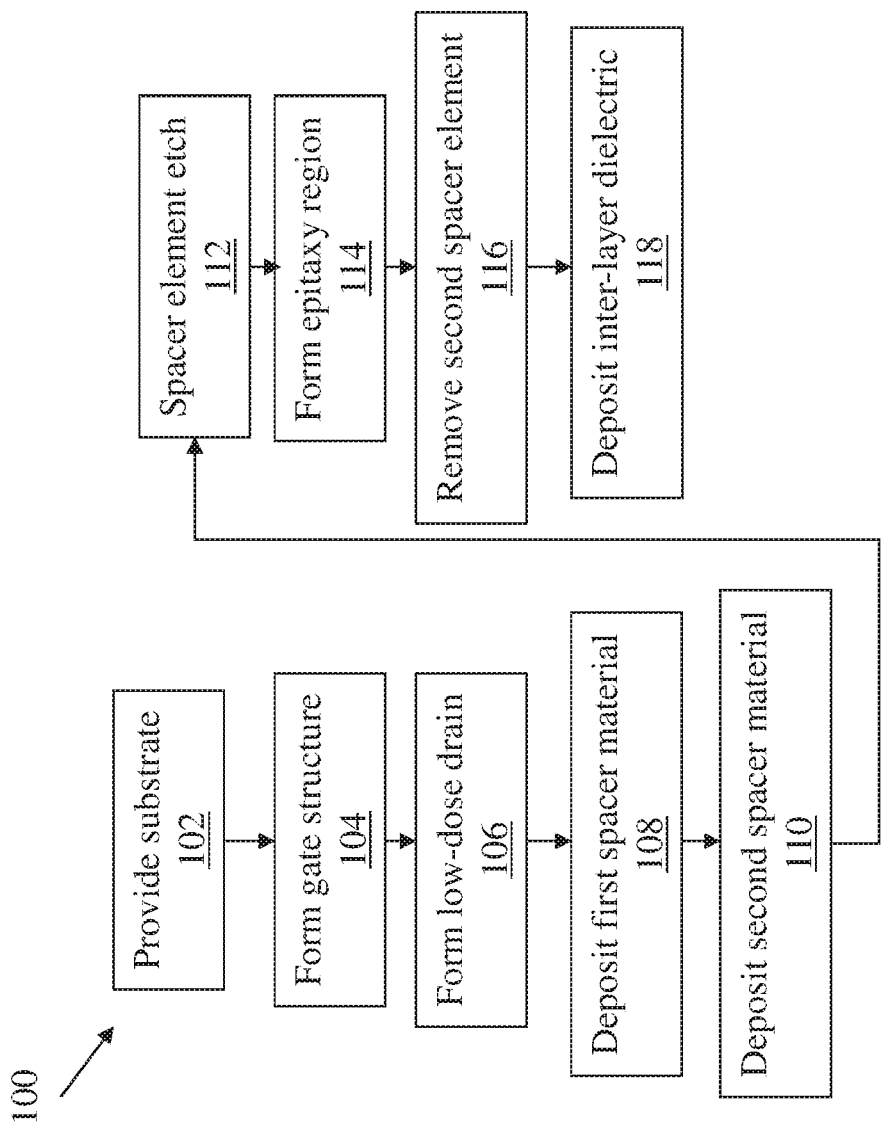
FIG. 1 is a flowchart illustrating an embodiment of a method according to one or more aspects of the present disclosure.
Figure 2:
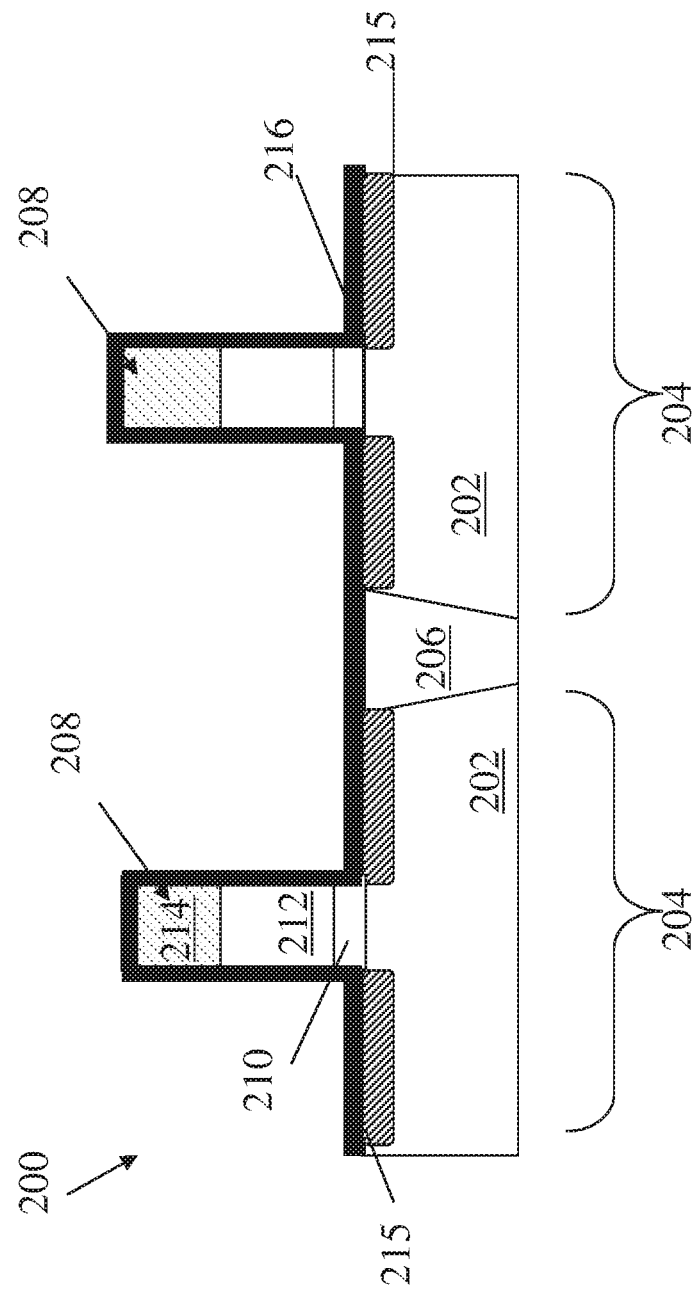
FIGS. 2-6 are cross-sectional views of an embodiment of a semiconductor device corresponding to steps of the method of FIG. 1.

Illustrated in FIG. 1 is a method 100 of fabricating a semiconductor device. The method 100 begins at block 102 where a substrate is provided. The substrate is a semiconductor substrate. Referring to the example of FIG. 2, a semiconductor device 200 includes a semiconductor substrate 202. In an embodiment, the substrate 202 is silicon in a crystalline structure. Other exemplary materials include other elementary semiconductors such as germanium, or compound semiconductors such as, silicon carbide, gallium arsenide, indium arsenide, and indium phosphide. The substrate 202 may be a silicon-on-insulator (SOI) substrate.

The substrate 202 includes active regions 204 and an isolation region 206. The active regions 204 may be suitably doped to provide a region for formation of active devices such as, an NMOS field effect transistor (NFET) or PMOS field effect transistor (PFET) semiconductor device. Though as illustrated herein the NFET region is provided on the relative left and the PFET region is provided on the relative right, with the isolation region 206 interposing the two, numerous configurations are possible.

The isolation region 204 is a shallow trench isolation (STI) structure. The STI structure may be formed by etching an aperture in the substrate 202 using processes such as reactive ion etch (RIE) after photolithography patterning, and/or other suitable processes. The apertures may then be filled with an insulator material, such as an oxide. In an embodiment, the process includes conformal low-pressure chemical vapor deposition (LPCVD) of oxide to fill an aperture, and continues with a chemical mechanical polish (CMP) process to planarize the oxide. Other suitable processes may be used in addition and/or in lieu of those described. In other embodiments, other isolation structures (e.g., LOCOS, field oxidation), may be used in addition to or in lieu of STI structures.

Referring again to FIG. 1, the method 100 then proceeds to block 104 where a gate structure (e.g., stack) is provided. Referring to the example of FIG. 2, gate structures 208 are disposed on the substrate 202. The gate structures 208 include gate structures that are, or will be formed into, gates of active (operational) devices (e.g., NFET or PFET devices). The gate structures 208 may be dummy gates (e.g., sacrificial gates) used in a gate replacement (also known as "gate-last") process of forming metal gate structures for operational devices. The gate structures 208 include one or more layers such as interface layers, gate dielectric layers, gate electrodes, hard mask layers, capping layers, work function layers, and/or other suitable layers. One or more of the layers may be sacrificial (e.g., as provided in a gate replacement process).

The gate structures 208 include a gate dielectric layer 210. The gate dielectric layer 210 may include a dielectric material such as, silicon oxide, silicon nitride, silicon oxynitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, or combinations thereof. The gate dielectric layer 210 may be formed using conventional processes such as, photolithography, oxidation, deposition, etching, and/or a variety of other processes known in the art. The gate dielectric layer 210 may be sacrificial, and subsequently replaced by a functional gate dielectric layer in a replacement process; in other embodiments, the gate dielectric layer 210 remains in the final device.

In an embodiment, the gate structure 208 includes a gate electrode layer 212. In an embodiment, the gate electrode 212 includes polysilicon. In embodiments, the gate electrode 212 is a sacrificial layer, which is subsequently replaced in a "gate last" or replacement gate process. The gate electrode layer 212 may be formed by suitable methods such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (AL-CVD), and/or other processes known in the art followed by a photolithography and etching processes. In other embodiments, the gate electrode 212 includes a metal composition such as, Cu, W, Ti, Ta, TiN, TaN, NiSi, CoSi, combinations thereof, and/or other suitable materials.

In embodiments, the gate structure 208 also includes a hard mask layer 214, which overlies the gate electrode layer 212. The hard mask layer 214 may include silicon oxide. Alternatively, the hard mask layer 214 may be silicon nitride, silicon oxynitride, and/or other suitable dielectric materials. The hard mask layer 214 may be formed using a method such as CVD, PVD, and/or other suitable processes.

Referring again to FIG. 1, the method 100 then proceeds to block 106 where a source/drain region is formed. The source/drain region may be or include a lightly doped source/drain region (also referred to as a low-dose region, a (e.g., low-dose source/drain, or LDD). Referring to the example of FIG. 2, LDD regions 215 are disposed in the substrate 202. The height of the gate structure 208 including the height of the hard mask layer 208 may influence an implant (e.g., implant angle) of the LDD regions 215. The LDD regions 215 may be formed using ion implantation of a suitable dopant (e.g., n-type or p-type), diffusion, and/or other suitable CMOS processes. The LDD regions 215 may include a pocket implant. The source/drain implant process (e.g., the LDD implant for the N/P FET) may be followed by an anneal step. In an embodiment, the anneal is a single-step anneal (SSA).

Referring again to FIG. 1, the method 100 then proceeds to block 108 where a first spacer material is deposited on the substrate. The first spacer material may be formed by PECVD and/or other suitable processes. The first spacer material may be a liner of a spacer element. Referring to the example of FIG. 2, spacer material 216 is disposed on the substrate 102. The spacer material 216 may be a conformal layer with substantially uniform thickness (e.g., accounting for fabrication process limitations). The spacer material 216 may also be referred to as a spacer element liner layer. The spacer material 216 may include silicon and carbon. In an embodiment, the spacer material 216 is SiCN. In another embodiment, the spacer material 216 is SiC. Other embodiments may include various other low-etch rate materials (e.g., low wet etching rate materials) compatible with CMOS processing. A low etch rate material may be one with a low etching rate in wet chemistry etches such as, HF, phosphoric acid, and/or other etchants typically used in processing, for example, to remove oxide films. In an embodiment, the material is selected such that it is substantially unetched by one or more of the wet chemistries described above. The spacer material 216 abuts the sidewalls of the gate structure 208 including covering the sidewalls of the gate electrode 212. In an embodiment, the spacer material 216 has a thickness of less than approximately 100 Angstroms.

Embodiments including the first spacer material may be advantageous in that the first spacer material (e.g., a low etch rate film) protects a gate sidewall to protect the critical dimension of the device during removal of one or more layers from the substrate, for example, removal of a dummy poly gate electrode. Other embodiments may include advantages such as protection of the gate sidewalls which may protect the gate CD during etching processes (e.g., wet etching). In conventional embodiments, wet etch processes (e.g., oxide etches) may damage spacer materials causing a drift in the critical dimensions of associated date structures. The first spacer material may also act to define a cavity (e.g., as a wall) for a subsequently formed metal-gate. These features are described further below.

Figure 3:
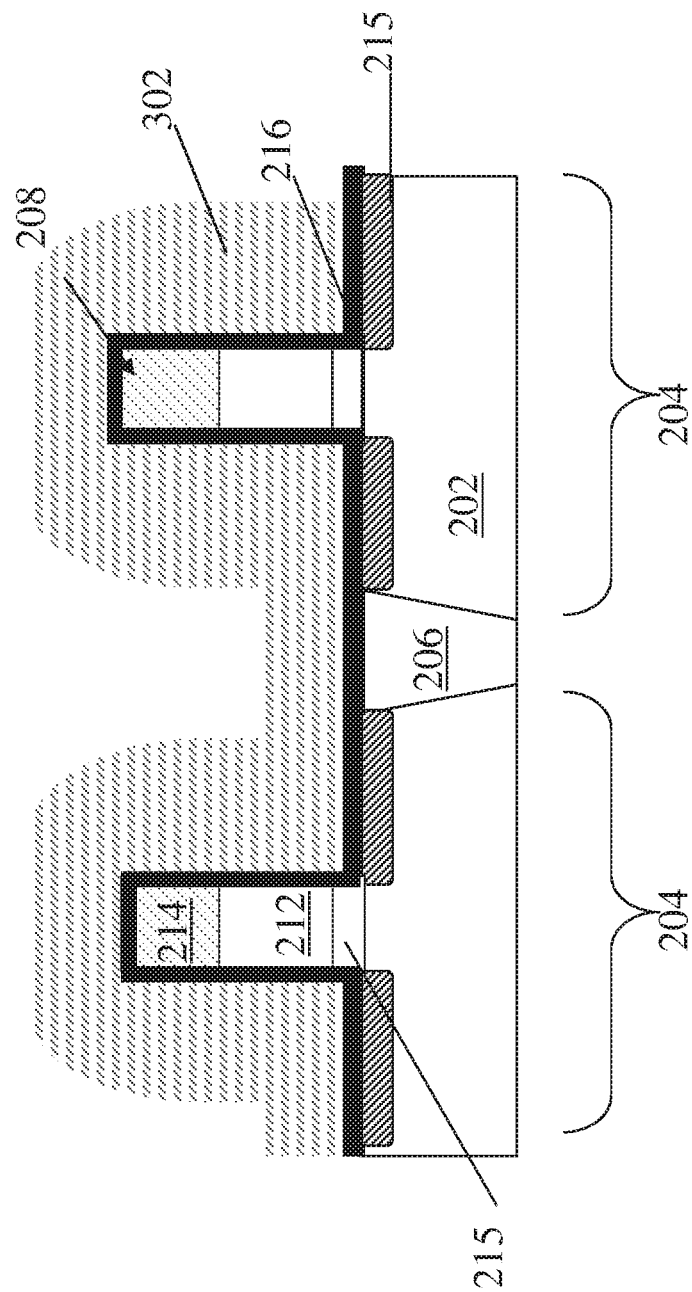

Referring again to FIG. 1, the method 100 then proceeds to block 110 where a second spacer material is deposited. The second spacer material may be deposited using physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other suitable processes. Referring to the example of FIG. 3, a spacer material 302 is deposited on the substrate 202. The spacer material 302 overlies the first spacer material 216. It is noted that in some embodiments there is no etch process performed on the spacer material 216 prior to the deposition of the spacer material 302. The spacer elements 302 may comprise silicon nitride. Other exemplary compositions include silicon oxide, silicon carbide, silicon oxynitride, combinations thereof, and/or other suitable materials. The spacer material 302 may be referred to as material for forming a main spacer.

The spacer material 302 and the spacer material 216 may be formed in-situ or at least substantially simultaneously (i.e., without interposing processing steps).

Figure 4:
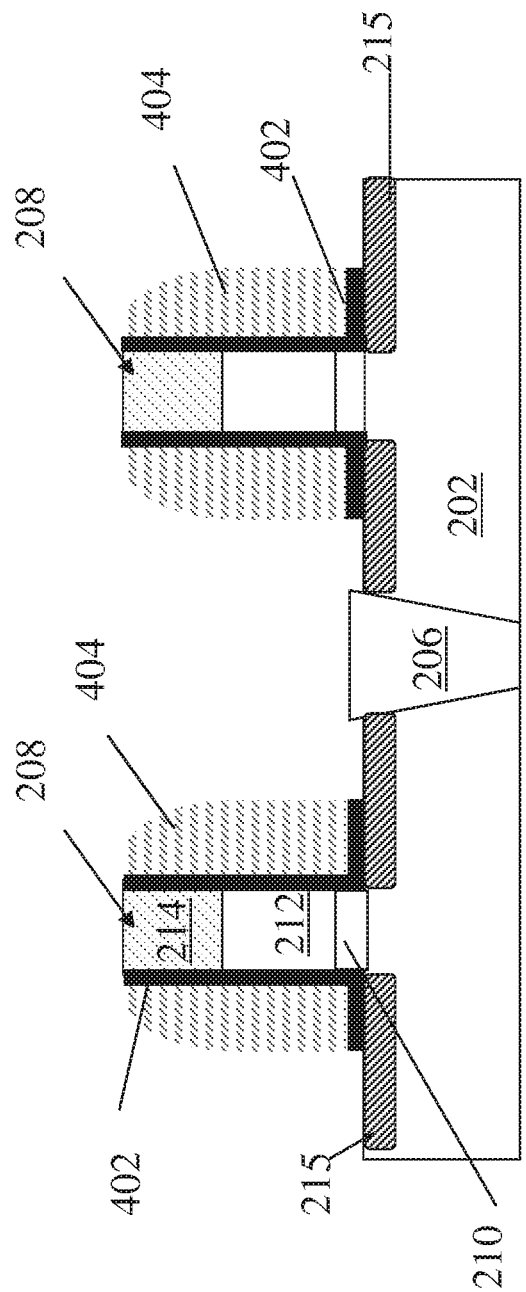

Referring again to FIG. 1, the method 100 then proceeds to block 112 where the spacer material is etched. The etching process may include an isotropic wet etch, dry etch, and/or other etching processes typical of CMOS fabrication processes. Referring to the example of FIG. 4, the spacer material 216 and the spacer material 302 have been etched forming spacers 402 and 404, respectively (i.e., first spacers 402 and second spacers 404). The spacer material 216 and the spacer material 302 have been removed from the substrate 202 in regions where an epitaxy region or raised source/drain will be formed. The first spacer material 216 may be removed from a top surface of a gate structure and/or portions of the surface of the substrate 202 where an epitaxy region will be grown. In an embodiment, the second spacer material forms a second spacer 404 which is approximately 20 nanometers in thickness. The spacer material 216 and/or the first spacer 402 may be approximately 100 Angstroms or less in thickness. The first spacer 402 may be referred to spacer element liner. The second spacer 404 may be referred to as a main spacer. It is noted that in the illustrated embodiment the spacer element 402 includes an L-type shape.

Included in, or in addition to, the spacer elements 402 and 404, a plurality of layers including those layers defining a wall for the gate structures 208 (e.g., in a replacement gate process), offset spacers, spacers that define a low-dosed region, liners, spacers that define a raised/source drain (e.g., epitaxy) region, and other suitable functions may be disposed on the substrate 202. In embodiments, the second spacer elements 404 are referred to as main spacer elements and/or the first spacer elements 402 are referred to as an offset spacer element. The first spacer 402 and/or the second spacer 404 may serve to define a region of the source/drain.

The first spacer 402 and/or the second spacer 404 may serve to define an epitaxy region (e.g., define or set an edge of an epitaxy region).

The spacer elements of blocks 108, 110 and 112 (in an embodiment, the spacer elements 402 and 404) may be formed substantially simultaneously (i.e., without intervening processes directed to other features of a device).

Figure 5:
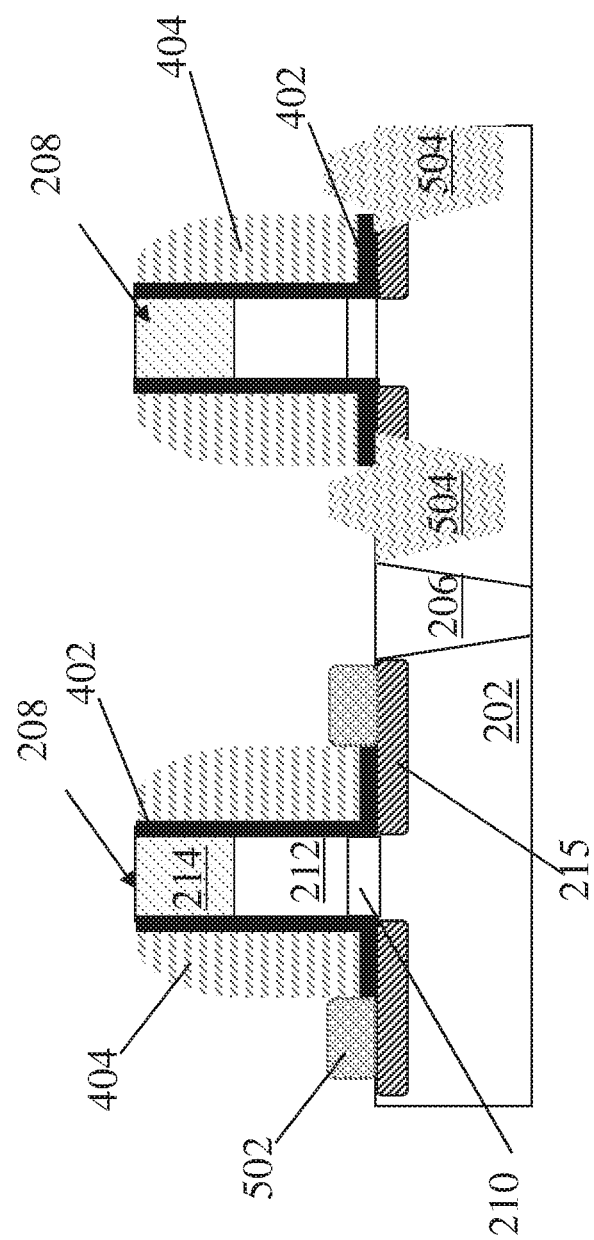

The method 100 then proceeds to block 114 where an epitaxy region is formed on the substrate. Referring to the example of FIG. 5, the epitaxy regions 502 and 504 are formed on the substrate. In an embodiment, the epitaxy region 502 is a silicon epitaxy region. The epitaxy region 502 may provide the source/drain for an active device such as an NFET. In an embodiment, the epitaxy region 504 is a silicon germanium epitaxy region. The epitaxy region 504 may provide the source/drain for an active device such as a PFET. However, numerous other embodiments of epitaxially grown materials are possible such as, silicon, silicon germanium, silicon carbide, germanium, gallium arsenide, indium phosphide, and/or other suitable materials. The epitaxy regions 502 and 504 may be raised source/drain regions (see FIG. 5), or in other embodiments, regions formed in the substrate 202 (e.g., having an approximately co-planar top surface with the substrate 202).

There may be an epitaxial growth selectivity between the substrate 202 and the spacer 404. This provides a suitable shape and/or position of the epitaxial region 504. Additionally, the spacer 404 may act as a protective element to protect (e.g., shield) the spacer 402 and the sidewall of the gate stack 208 during the epitaxial process.

It is noted that the first spacer element 402 may protect the sidewall of the gate structure 208 during an epitaxial growth process. In an embodiment, the gate electrode layer 212 includes polysilicon. The first spacer element 402 protects the gate electrode layer 212 including its sidewall from undesired growth of epitaxy material during the growth process of forming the regions 502 and/or 504. Thus, the thickness of the hard mask layer 214, which may ensure the gate electrode 212 is not exposed during loss of spacer height, may be decreased from conventional processes. In an embodiment, the hard mask layer 214 is between approximately 700 A and approximately 950 A in thickness. In comparison to a process having multiple etches to form the spacers (e.g., first spacer material deposited and etched, second spacer material deposited and etched), this allows for a decreased hard mask thickness as less material may be lost to the etching processes. A decreased hard mask layer 214 may allow for a more desirable (e.g., larger) pocket implant angle. The spacer element 402 also allows for controlled spacer edge loss during etching processes for epitaxy volume control (e.g., critical dimension, CD). In one or more embodiments, this is because the spacer element 402 includes a low-etch rate material (e.g., SiCN, SiC).

Figure 6:
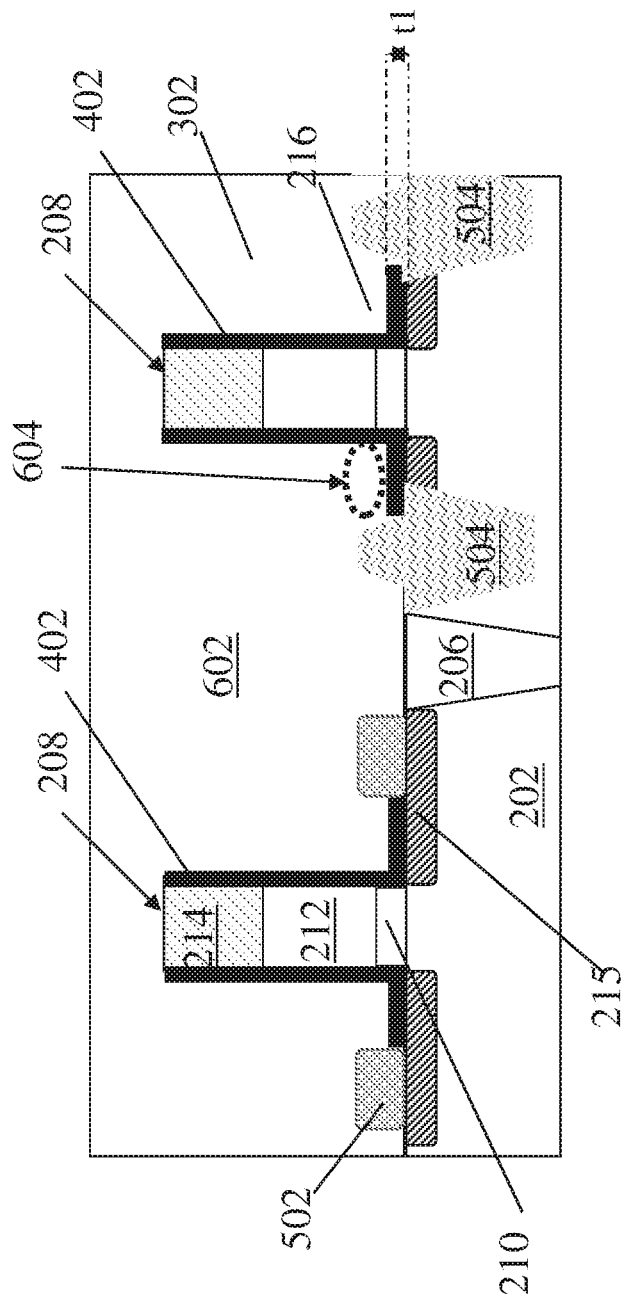

The method 100 then proceeds to block 116 where the second spacer element is removed from the substrate. The second spacer element may be removed using a suitable wet or dry etching process typical of CMOS fabrication. Referring to the example of FIG. 6, the device 600 illustrates the removal of the spacer elements 404. The spacer element 402 remain on the substrate 202. The spacer element 402 may remain on the substrate.

The method 100 then proceeds to block 118 where an interlayer dielectric (ILD) layer is formed on the substrate. Referring to the example of FIG. 6, an ILD layer 602 is formed on the substrate 202. The ILD layer 602 may include may include dielectric materials such as, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), SILK (a product of Dow Chemical of Michigan), BLACK DIAMOND (a product of Applied Materials of Santa Clara, Calif.), and/or other materials known in the art. The ILD layer 602 may be deposited by PECVD, spin-on coating, and/or other suitable deposition processes.

It is noted that the presence of the spacer element 402 may be advantageous in decreasing an aspect ratio of a fill region for the ILD layer 602 (e.g., provide improved gap fill). For example, identified region 604 illustrates a reduced aspect ratio due to the presence of the spacer element 402. The thickness of the spacer element 402, t1, may be less than approximately 100 angstroms. The thickness of the spacer element 402 serves to decrease the depth of the region to fill between the epitaxy region 502/504 and the gate structure 208. The spacer element 402 may also define a cavity (e.g., protect the CD of a gate) for a gate-last process, within which a metal gate is formed. Thus, the spacer element 402 may include a composition that is selective to one or more etch processes used to remove and replace a dummy gate (e.g., HF dry etch). In an embodiment, the spacer element 402 is of a different material than the dielectric 210. In an embodiment, the dielectric 210 is a dummy gate dielectric and the spacer element 402 is comprised such that the spacer element 402 is not attacked (e.g., removed) during the removal of the dummy gate dielectric 210.

It is understood that the method 100 may continue with a CMOS process flow to form various structures and features such as silicide features, contact etch stop layers (CESL), additional inter-level dielectric (ILD) layers, contact/vias, interconnect layers, metal layers, dielectric layers, passivation layer and so forth. In an embodiment, the gate structures fabricated as described above, including in block 104, remain in the final circuit. In other embodiments, the gate structures are partially and/or completely removed and the resulting trench refilled with materials proper for forming a gate of a semiconductor device. Various layers of a multiple layer interconnect (MLI) are formed on the substrate to connect the various features described above.

Figure 7:
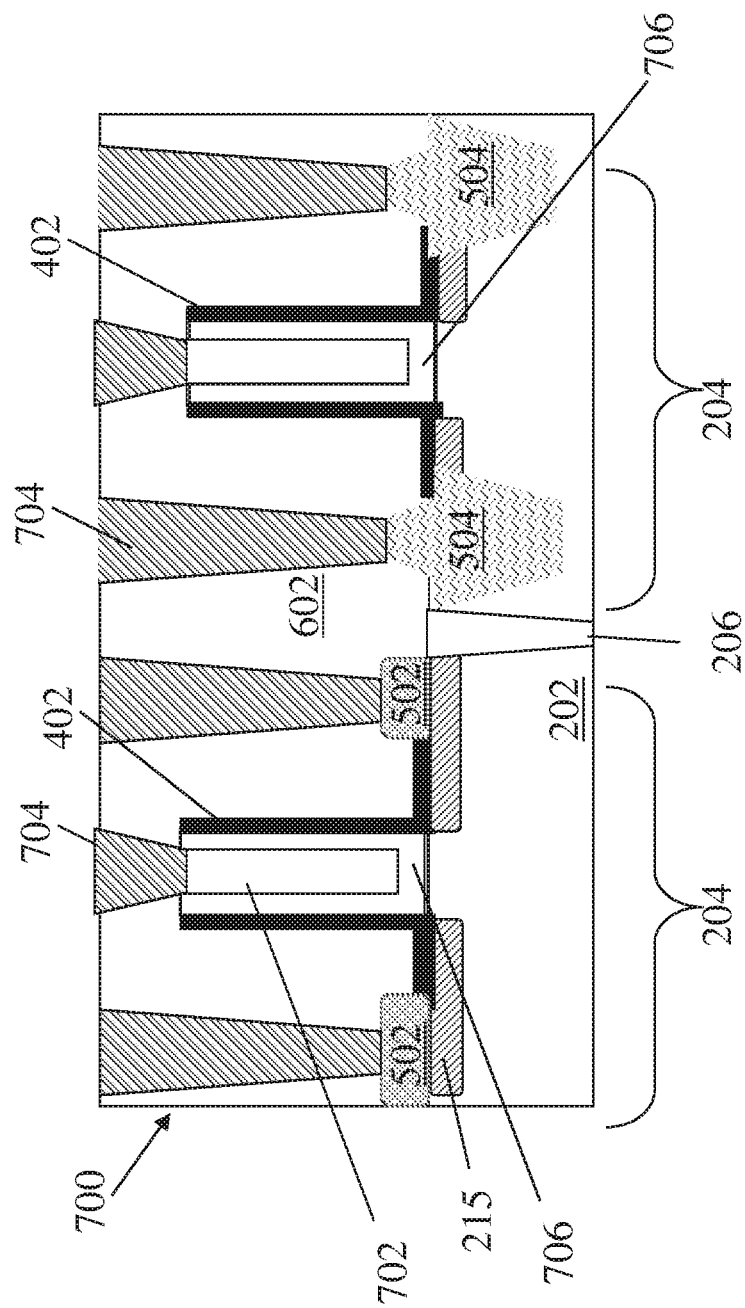
FIG. 7 is a cross-sectional view of an embodiment of a semiconductor device according to one or more aspects of the present disclosure.

Referring now to FIG. 7, illustrated is a device 700 that includes one or more aspects of the present disclosure. The device 700 may be substantially similar to the devices of FIGS. 2, 3, 4, 5, and/or 6, and/or fabricated using one or more elements of the method 100, all described above.

The device 700 includes a semiconductor substrate 202 having active regions 204 and an isolation region 206 interposing the active regions 204, lightly doped source and drain (LDD) regions 215, epitaxy regions 502 and 504, an ILD layer 602, and spacer elements 402. The spacer elements 402 may be a liner layer of a spacer with one or more layers. One or more of these elements may be substantially similar to as described above with reference to the method 100. The spacer elements 402 may include silicon and/or carbon, selected, for example, to provide a low etch rate. In an embodiment, the spacer elements 402 are SiCN. In an embodiment, the spacer elements 402 are SiC. The spacer elements 402 have an interface (e.g., region in direct contact) with the epitaxy region 502 or 504. It is noted that the device 700 is also advantageous in that the ILD layer 602 has improved gap fill due to the reduction of the aspect ratio between a region between the epitaxy regions 502/504 and the adjacent gate structure.

The gate structures of the device 700 may be substantially similar to the gate structures 208 described above with reference to FIGS. 1 and 2. The gate structures include a gate dielectric 210 and a gate electrode 702. The gate dielectric 210 may be substantially similar to as described above with reference to FIGS. 1 and 2. In embodiments, the gate electrode 702 is a metal gate with the gate electrode including a metal composition. Examples of suitable metals for forming the gate electrode include Cu, W, Ti, Ta, TiN, TaN, NiSi, CoSi, combinations thereof, and/or other suitable materials. The gate structure of the device 700 may further comprise a contact layer disposed over the gate electrode to reduce contact resistance and improve performance. The contact layer may include metal silicide. The device 700 further includes contact features 704. The contact features 704 may be tungsten plugs, and/or other suitable elements typical of a CMOS process. The gate structure of the device 700 further includes a gate dielectric 706. The gate dielectric 706 may include a dielectric material such as, silicon oxide, silicon nitride, silicon oxynitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, or combinations thereof. The gate dielectric layer 706 may be formed using conventional processes such as, photolithography, oxidation, deposition, etching, and/or a variety of other processes known in the art. The gate dielectric layer 706 may be a replacement dielectric, for example, for gate dielectric 210 illustrated above.

Figure 8:
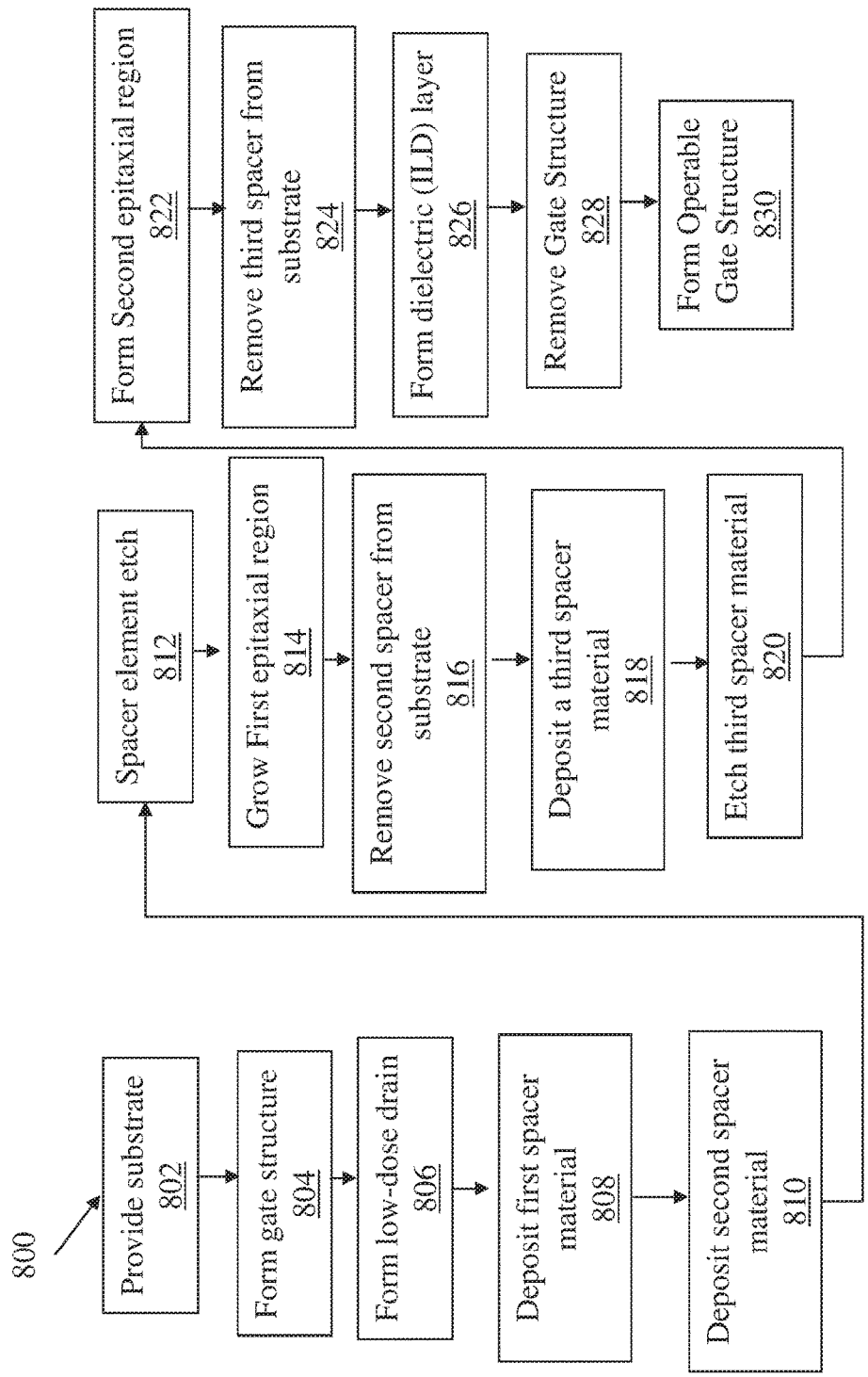
FIG. 8 is a flowchart illustrating an embodiment of a method according to one or more aspects of the present disclosure.

Referring now to FIG. 8, illustrated is an embodiment of a method 800 of fabricating a semiconductor device. The method 800 is substantially similar to the method 100, with differences detailed herein. Blocks 802, 804, 806, 808, and 810 are substantially similar to similarly labeled blocks 102, 104, 106, 108, and 110 of the method 100.

The method 800 then proceeds to block 812 where the spacer material is etched. The etching process may include an isotropic wet etch, dry etch, and/or other etching processes typical of CMOS fabrication processes. Referring to the example of FIG. 9, the spacer material 216 and the spacer material 302, see FIG. 3, have been etched forming spacers 902 and 904, respectively (i.e., first spacers 902 and second spacers 904).

The spacer material 216 and the spacer material 302 have been removed from the substrate 202 in regions where a first epitaxy region will be formed. The spacer material 216 and/or the first spacer 902 may be approximately 100 Angstroms or less in thickness. The first spacer 902 may be referred to as spacer element liner. The second spacer 904 may be referred to as a main spacer. It is noted that in the illustrated embodiment the spacer element 902 includes an L-type shape.

Figure 9:
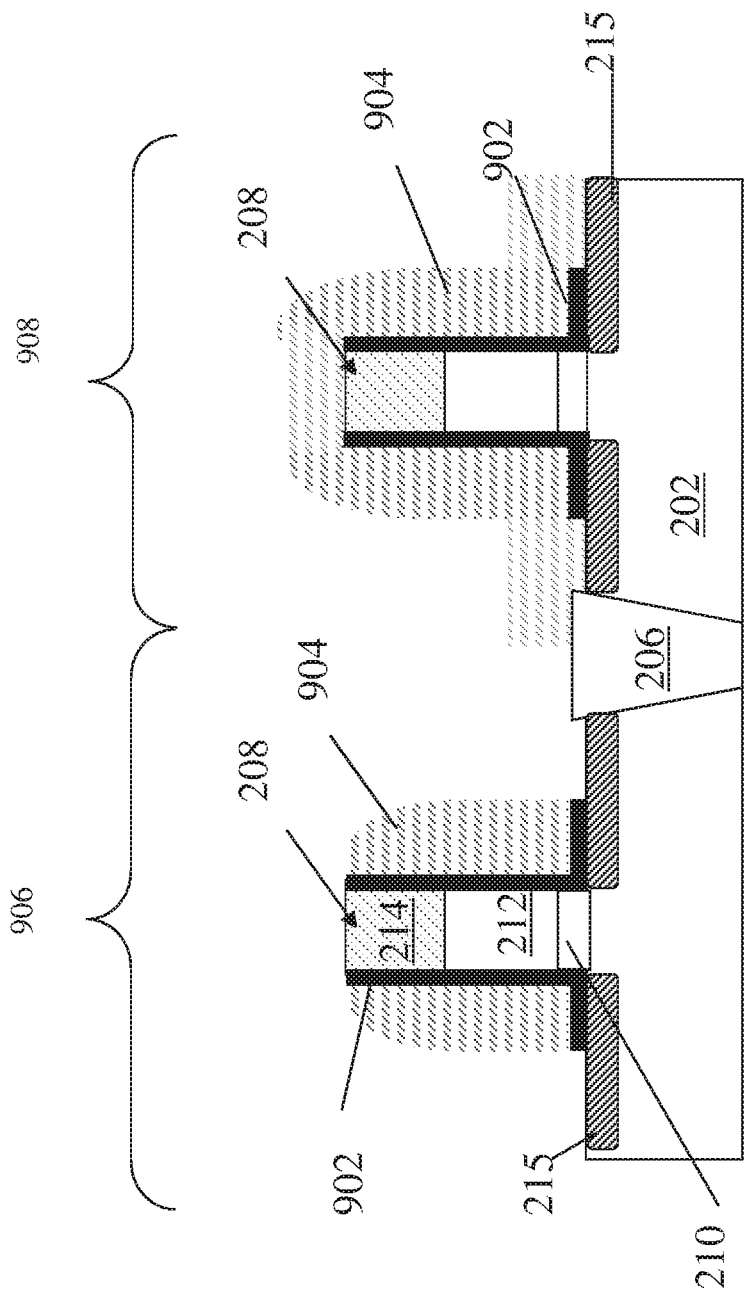
FIGS. 9-17 are cross-sectional views of an embodiment of a semiconductor device corresponding to steps of the method of FIG. 8.

The embodiment of FIG. 9 illustrates the second spacer 904 remains over the region 908. The region 908 may be a PFET device region. The second spacer 904 include a composition that is selective to an epitaxial growth process performed on the substrate 202 (i.e., will not grow epi thereon). In an embodiment, the second spacer 904 is SiN. In an embodiment, the first spacer 902 is SiCN.

Figure 10:
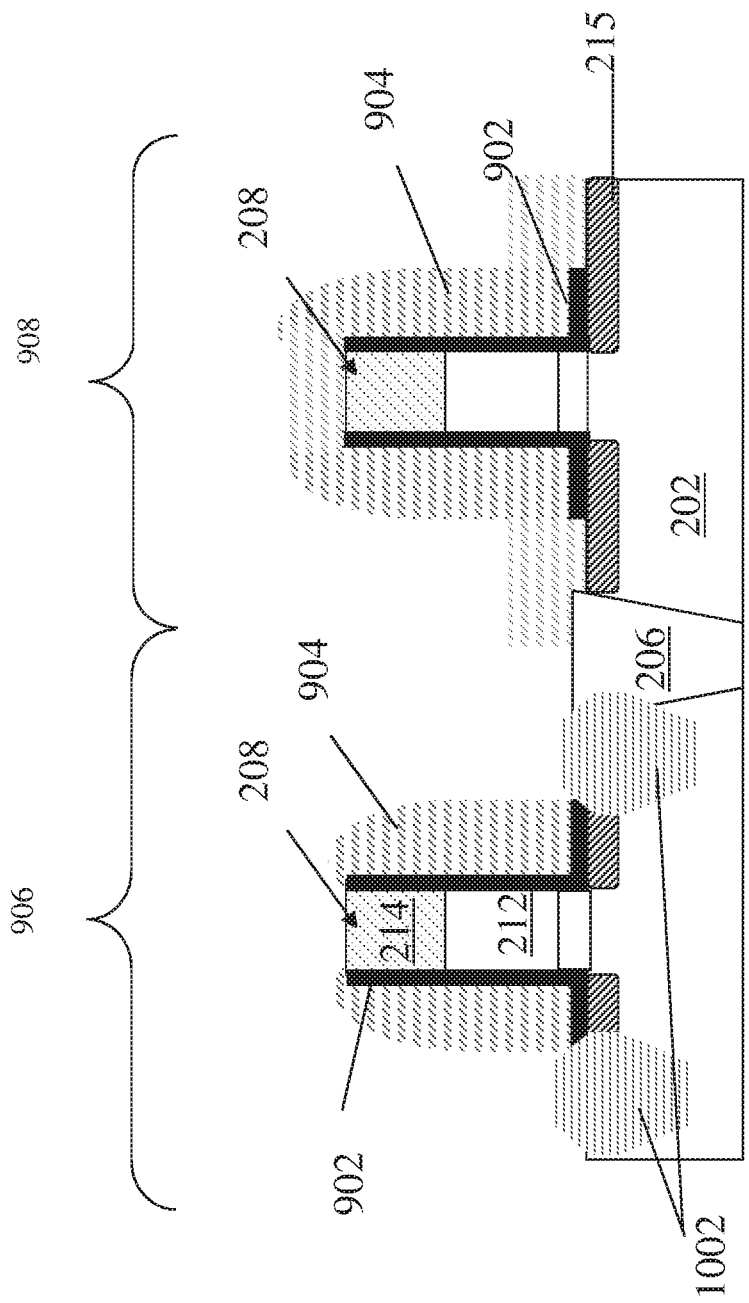

The method 800 then proceeds to block 814 where a first epitaxial region is grown. Block 814 may be substantially similar to block 114 of the method 100, described above. In an embodiment, the first epitaxial region is provided to form a source/drain region of a device (e.g., NFET). The epitaxy process may include an in-situ provided dopant, preclean processes, and/or other suitable processes. Referring to the example of FIG. 10, epitaxy regions 1002 are disposed on the substrate 202. The epitaxy regions 1002 may be silicon epitaxy. The regions 1002 may be doped or un-doped. The epitaxy regions 1002 may form a source/drain region for a device formed in the region 906. In an embodiment, the region 906 defines an NFET device region. In other words, in an embodiment the epitaxy regions 1002 form a source/drain region of an NFET device. The spacers 904 and/or 902 may provide protection from unwanted epitaxial growth, for example, on the gate structure 208. It is noted that spacer 904 may encase the spacer 902 (e.g., including the top surface of the spacer 902).

Figure 11:
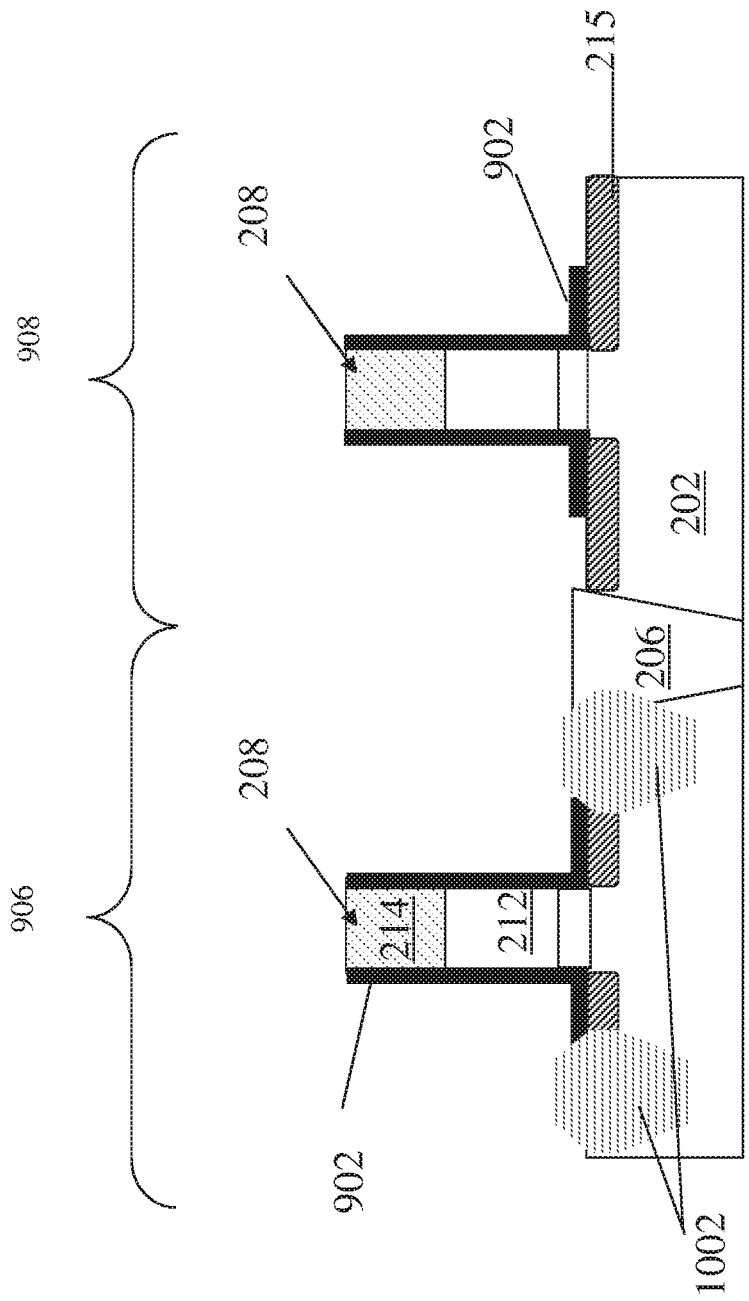

The method 800 then proceeds to block 816 where the second spacer is removed from the substrate. Block 816 may be substantially similar to block 116, described above with reference to the method 100 of FIG. 1. In an embodiment, the second spacer is removed using a wet etchant such as, $H_3PO_4$. Referring to the example of FIG. 11, the spacer element 904 is removed.

Figure 12:
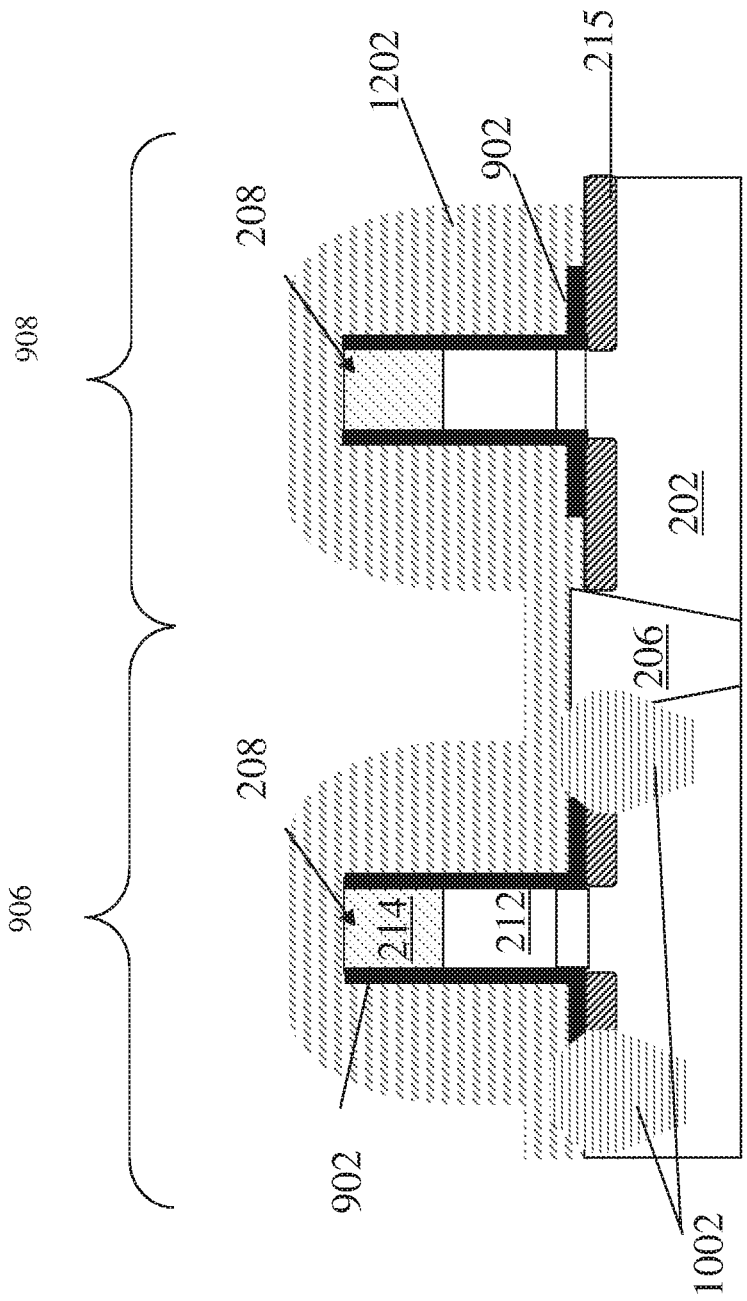

The method 800 then proceeds to block 818 where a third spacer material is formed on the substrate. The third spacer material may be substantially similar to the second spacer material described above. Block 818 may be substantially similar to block 810 and/or block 110 of the method 100. Referring to the example of FIG. 12, third spacer material 1202 is formed on the substrate 202.

Figure 13:
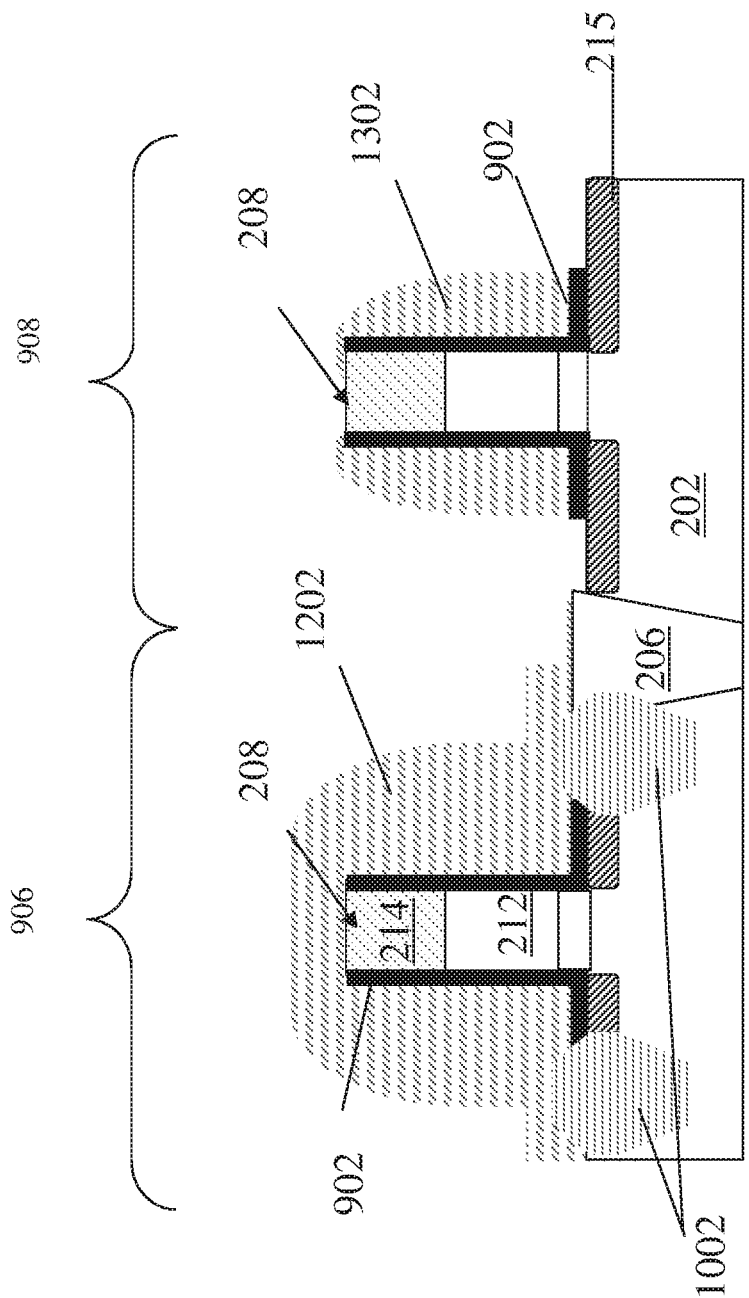

The method 800 then proceeds to block 820 where the third spacer material is etched from a region of the substrate. The etching process may include an isotropic wet etch, dry etch, and/or other etching processes typical of CMOS fabrication processes. Referring to the example of FIG. 13, the spacer material 1202 has been etched forming spacers 1302 in region 908. In an embodiment, region 908 defines a PFET device region. More specifically, the spacer material 1202 has been removed from the substrate 202 in regions where a second epitaxy region will be formed. The spacer material 1202 remains in the region 906 (e.g., NFET device region).

Figure 14:
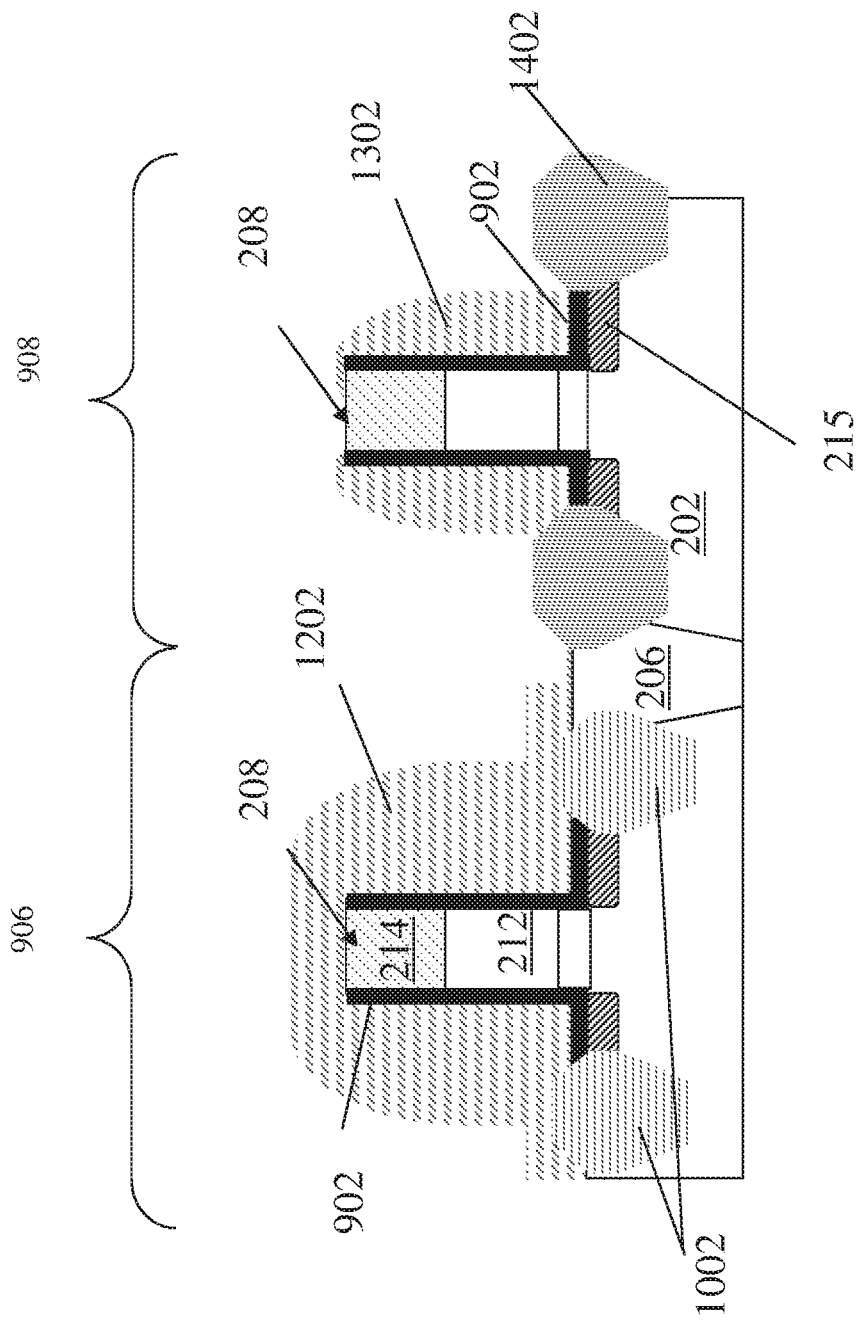

The method 800 then proceeds to block 822 where a second epitaxial region is formed. Block 822 may be substantially similar to block 114 of the method 100, described above. In an embodiment, the second epitaxial region is provided to form a source/drain region of a device (e.g., PFET). The epitaxy process may include forming a trench in the substrate within which the epitaxy is grown. The epitaxy process may further include an in-situ provided dopant, preclean processes, and/or other suitable processes. In an embodiment, the second epitaxial region is silicon germanium. Referring to the example of FIG. 14, epitaxy regions 1402 are disposed on the substrate 202. The epitaxy regions 1402 may be SiGe. The epitaxy regions 1002 may form a source/drain region for a device formed in the region 908. In an embodiment, the region 908 defines a PFET device region. In other words, in an embodiment the epitaxy regions 1402 form a source/drain region of a PFET device. The epitaxy region 1402 may provide a raised source/drain region.

Figure 15:
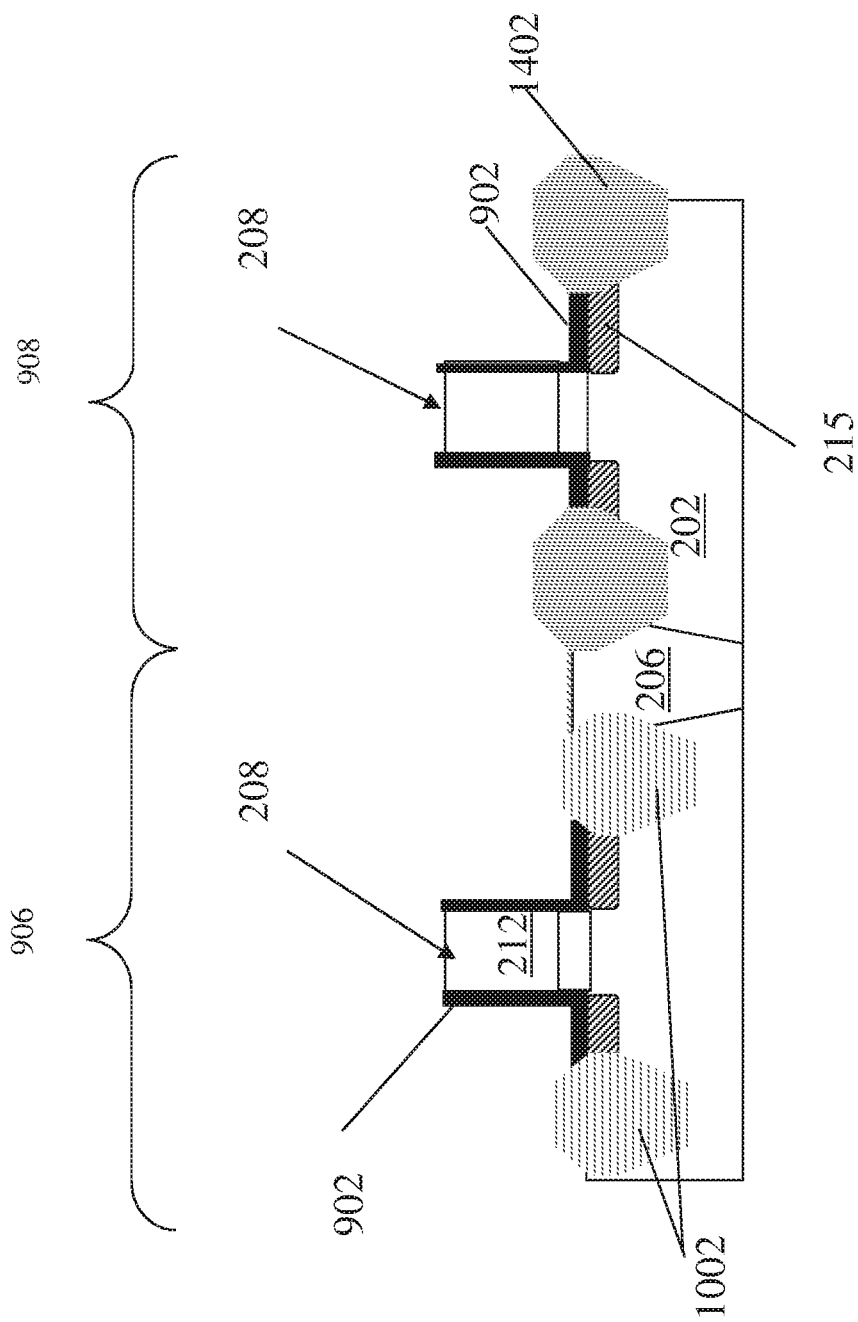

The method 800 then proceeds to block 824 where the third spacer is removed from the substrate. Block 824 may be substantially similar to block 116, described above with reference to the method 100 of FIG. 1 and/or block 816 described above. In an embodiment, the third spacer is removed using a wet etchant such as, $H_3PO_4$. Referring to the example of FIG. 15, the spacer element 1302 and the spacer material 1202 is removed. In embodiments, the hard mask layer 214 may be removed and the portion of the spacers adjacent the hard mask layer 214 sidewalls in the same or subsequent process.

Figure 16:
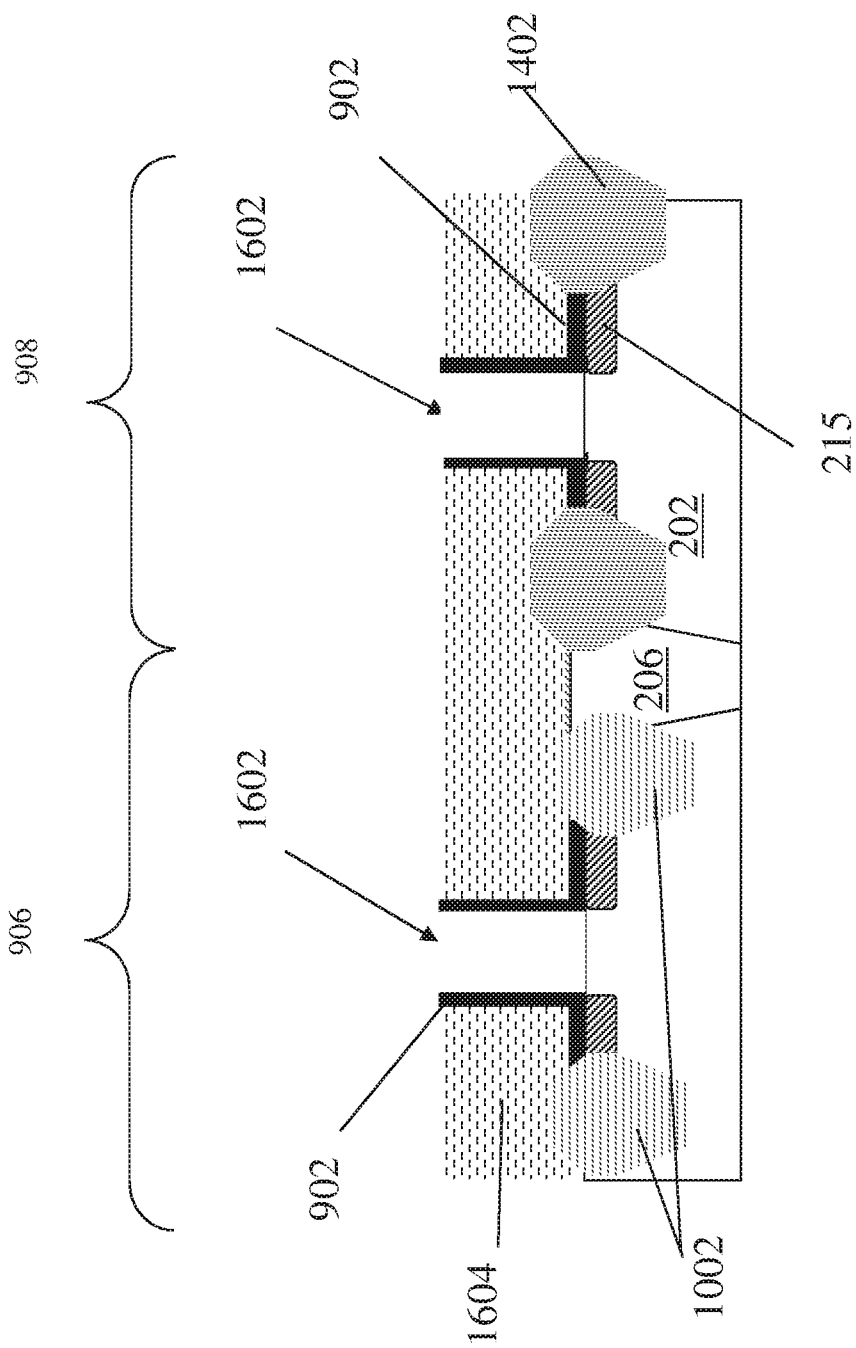

The method 800 then proceeds to block 826 where a dielectric layer is formed on the substrate. The block 826 may be substantially similar to block 118, described above with reference to the method 100 of FIG. 1. After depositing the dielectric material, a chemical mechanical polish process may be performed. The method 800 may include advantages in the formation of the dielectric layer as it has an improved gap fill because of the presence of the first spacers. Referring to the example of FIG. 16, an ILD layer 1604 is formed on the substrate 202. The ILD layer 1604 may include may include dielectric materials such as, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), SILK (a product of Dow Chemical of Michigan), BLACK DIAMOND (a product of Applied Materials of Santa Clara, Calif.), and/or other materials known in the art. The ILD layer 1604 may be deposited by PECVD, spin-on coating, and/or other suitable deposition processes. The ILD layer 1604 of FIG. 16 is illustrated after CMP.

The method 800 then proceeds to block 828 where the gate structure is removed. The gate structure is described above with reference to block 804 and may include a dummy gate structure. It is noted that a portion of the dummy gate structure (e.g., hard mask layer) may have been previously removed. The dummy gate structure may be removed using an etchant such as HF. The spacer elements 902 may be formed of a material that is resistant (e.g., has a high etch selectivity) to the etchant. Referring to the example of FIG. 16, the gate electrode layer 212 and the gate dielectric layer 210, both sacrificial (or dummy) features, have been removed leaving trench 1602 defined by the spacer elements 902.

Figure 17:
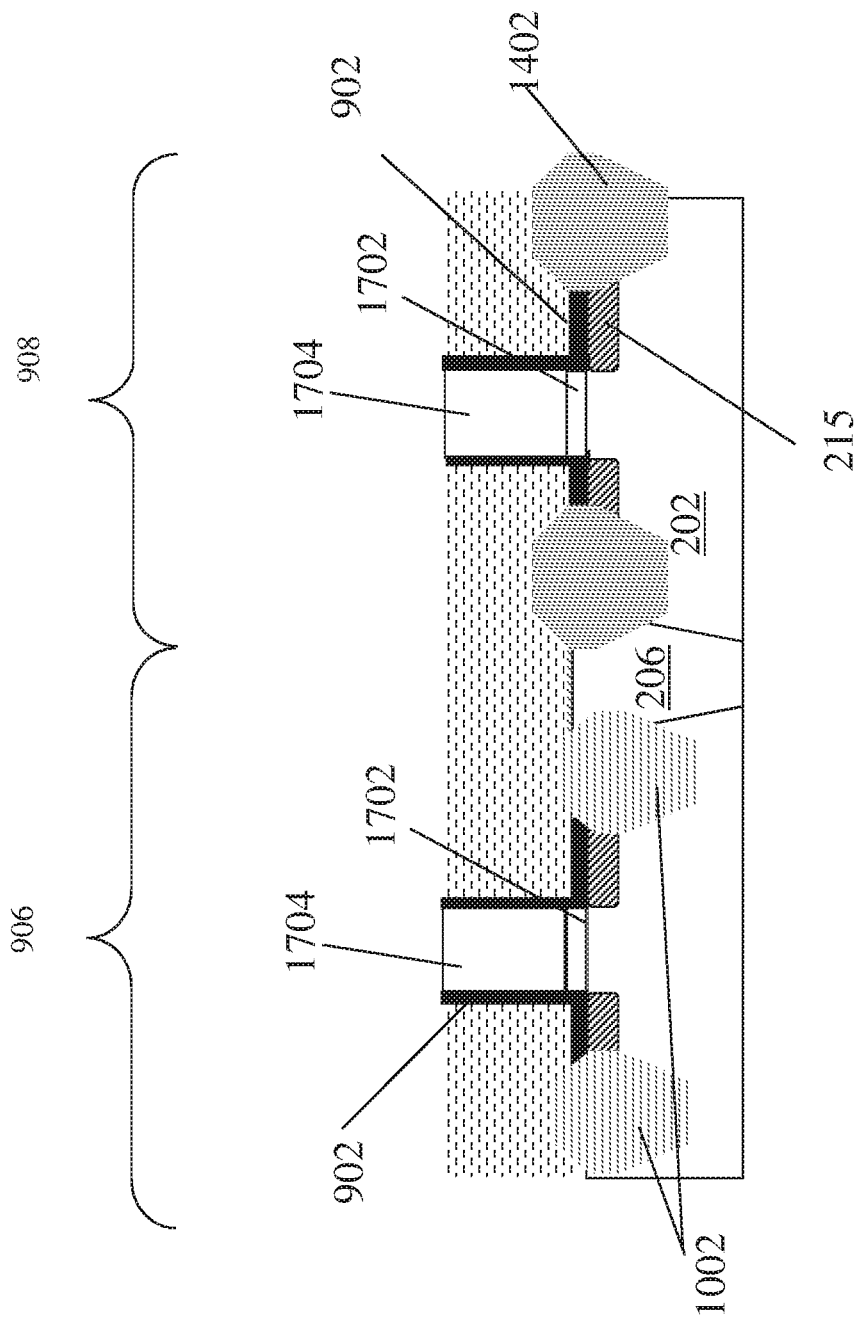

The method 800 then proceeds to block 830 where a gate is formed. The gate may be the operable gate(s) of the devices. In an embodiment, the gate includes a high-k dielectric and a metal gate electrode. Referring to the example of FIG. 17, a gate dielectric 1702 and gate electrode 1704 are formed in the trench 1602 (see FIG. 16). The gate dielectric 1702 in region 906 may be the same as or different than (e.g., composition) the gate dielectric 1702 in region 908. The gate electrode 1704 in region 906 may be the same as or different than the gate electrode 1704 in region 908.

The gate dielectric layer 1702 may include a dielectric material such as, silicon oxide, silicon nitride, silicon oxynitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, or combinations thereof. The gate dielectric layer 1702 may be formed using conventional processes such as, photolithography, oxidation, deposition, etching, and/or a variety of other processes known in the art. The gate electrode layer 1704 may be formed by suitable methods such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art followed by a photolithography and etching processes. In embodiments, the gate electrode 1704 includes a metal composition such as, Cu, W, Ti, Ta, TiN, TaN, NiSi, CoSi, combinations thereof, and/or other suitable materials.

Thus, described herein are aspects of an embodiment of a method which includes providing a substrate and forming a first spacer material layer abutting a gate structure on the substrate. A second spacer material layer is formed adjacent and abutting the gate structure and overlying the first spacer. The first spacer material layer and the second spacer material layer are then etched concurrently to form a first spacer and a second spacer, respectively. An epitaxy region is formed (e.g., grown) on the substrate which includes an interface with each of the first and second spacers. The first spacer may be a liner layer.

In some embodiments, the method further includes forming a low-dose drain region prior to forming the first spacer. In some embodiments, the method further includes removing the second spacer after forming the epitaxy region. An interlayer dielectric (ILD) layer may be formed on the substrate after removing the second spacer; the ILD layer may include an interface with the first spacer.

In an embodiment, the first spacer material layer includes SiCN. In another embodiment, SiC. In an embodiment, the second spacer material layer includes silicon nitride. The etching the first and the second spacer material layer concurrently may include removing the first spacer material layer from a top surface of the gate structure and exposing a region of the substrate where the epitaxy region will be formed.

In some embodiments, forming the first spacer material layer includes forming a conformal layer, which is not etched prior to depositing material to form the second spacer.

In another embodiment, a method is described which includes providing a semiconductor substrate and forming a dummy gate structure on the semiconductor substrate. A spacer element liner layer is formed on the sidewalls of the dummy gate structure. Thereafter, a second spacer is formed abutting the spacer element liner layer. An epitaxy region is then grown on the semiconductor substrate adjunct the spacer element liner layer and the second spacer.

In some embodiments, growing the epitaxy region creates an interface between the epitaxy region and the liner layer. Forming the liner layer may include forming a layer of substantially uniform thickness. In some embodiments, the liner layer is not etched prior to the forming the second spacer. In an embodiment, the dummy gate structure is removed to provide a trench and a metal gate is formed in the trench.

In some embodiments, an exemplary method includes forming a first dummy gate structure and a second dummy gate structure over a substrate and forming a first set of spacers adjacent to the first dummy gate structure and a second set of spacers adjacent to the second dummy gate structure. The first set of spacers and the second set of spacers each include spacer liners disposed respectively on sidewalls of the first dummy gate structure and the second dummy gate structure and first spacers disposed on the spacer liners. The spacer liners include silicon and carbon. The method further includes forming first source/drain epitaxy regions over the substrate, wherein the first source/drain epitaxy regions are disposed adjacent to the first set of spacers, and further wherein the first dummy gate structure is disposed between the first source/drain epitaxy regions. After forming the first source/drain epitaxy regions, the first spacers from the first set of spacers and the second set of spacers are replaced with second spacers, wherein the second spacers are disposed on the spacer liners. The method further includes forming second source/drain epitaxy regions over the substrate, wherein the second source/drain epitaxy regions are disposed adjacent to the second set of spacers, and further wherein the second dummy gate structure is disposed between the second source/drain epitaxy regions. The second spacers are removed after forming the second source/drain epitaxy regions. The method further includes replacing the first dummy gate structure and the second dummy gate structure respectively with a first gate structure and a second gate structure. The replacing includes removing the first dummy gate structure and the second dummy gate structure to respectively form a first trench and a second trench defined by the respective spacer liners, wherein the first gate structure is formed in the first trench and the second gate structure is formed in the second trench.

In some embodiments, the method further includes forming first lightly doped source and drain (LDD) regions and second LDD regions in the substrate, wherein the first dummy gate structure is disposed between the first LDD regions and the second dummy gate structure is disposed between the second LDD regions. The first set of spacers and the second set of spacers are formed after forming the first LDD regions and the second LDD regions. In some embodiments, the method further includes forming an interlevel dielectric (ILD) layer over the substrate after removing the second spacers, wherein the ILD layer is disposed directly on the spacer liners. In some embodiments, forming the first set of spacers and the second set of spacers includes depositing a first spacer material layer over the first dummy gate structure, the second dummy gate structure, and the substrate, depositing a second spacer material layer over the first spacer material layer, and etching the first spacer material layer and the second spacer material layer to respectively form the spacer liners and the first spacers. The second spacer material layer may be different than the first spacer material layer.

In some embodiments, the first dummy gate structure is disposed between first source/drain regions, wherein the first epitaxy source/drain regions are formed in the first source/drain regions; and the second dummy gate structure is disposed between second source/drain regions, wherein the second epitaxy source/drain regions are formed in the second source/drain regions. In such embodiments, the etching the first spacer material layer and the second spacer material layer may include removing the second spacer material layer from a portion of the first source/drain regions, while leaving the second spacer material layer covering the second source/drain regions. In such embodiments, the replacing the first spacers with the second spacers may include conformally depositing a third spacer material layer over the spacer liners and etching the third spacer material layer to form the second spacers. The third spacer material layer may be different than the first spacer material layer etched to form the spacer liners. In such embodiments, the etching the third spacer material layer may include removing the third spacer material layer from a portion of the second source/drain regions, while leaving the third spacer material layer covering the first source/drain regions In some embodiments, another exemplary method includes forming a dummy gate structure over a substrate; forming a first spacer material layer over the dummy gate structure and the substrate, wherein the first spacer material layer includes silicon and carbon; forming a second spacer material layer over the first spacer material layer, wherein the second spacer material layer is different than the first spacer material layer; and etching the first spacer material layer and the second spacer material layer to respectively form spacer liners and first spacers, wherein the spacer liners are disposed on sidewalls of the dummy gate structure and the first spacers are disposed on the spacer liners. The method further includes forming source/drain epitaxy regions over the substrate, wherein dummy gate structure is disposed between the source/drain epitaxy regions; after forming the source/drain epitaxy regions, replacing the first spacers with second spacers, wherein the second spacers are disposed on the spacer liners; and replacing the dummy gate structure with a gate structure. The replacing can include removing the dummy gate structure to form a trench defined by the spacer liners in which the gate structure is formed. In some embodiments, the second spacers are removed before replacing the dummy gate structure. In some embodiments, the method further includes forming an interlevel dielectric (ILD) layer over the substrate after removing the second spacers, wherein the ILD layer is disposed directly on the spacer liners.

In some embodiments, the method further includes forming lightly doped source and drain (LDD) regions in the substrate, wherein the dummy gate structure is disposed between the LDD regions. The spacer liners and the first spacers may be formed after forming the LDD regions. In some embodiments, the first spacer material layer is not etched before etching the second spacer material layer. In some embodiments, replacing the first spacers with the second spacers includes forming a third spacer material layer over the spacer liners and etching the third spacer material layer to form the second spacers. The third spacer material layer may be different than the first spacer material layer etched to form the spacer liners.

In some embodiments, the dummy gate structure is a first dummy gate structure and the source/drain epitaxy regions are first source/drain epitaxy regions. In such embodiments, the method further may further include, after replacing the first spacers with the second spacers, forming second source/drain epitaxy regions over the substrate, wherein a second dummy gate structure is disposed between the second source/drain epitaxy regions. The second spacers may cover the first source/drain epitaxy regions during the forming of the second source/drain epitaxy regions. In such embodiments, the etching the first spacer material layer and the second spacer material layer may further form a set of spacers disposed adjacent to the second dummy gate structure, wherein the set of spacers includes other spacer liners disposed on sidewalls of the second dummy gate structure and other first spacers disposed on the other spacer liners. In such embodiments, during the forming of the first source/drain epitaxy regions, the other first spacers may cover an area of the substrate where second source/drain epitaxy regions are to be formed.

In some embodiments, another exemplary method includes forming a dummy gate structure over a substrate and forming a set of spacers adjacent to the dummy gate structure. The set of spacers includes spacer liners disposed on sidewalls of the dummy gate structure and main spacers disposed on the spacer liners. The spacer liners include silicon and carbon. The method further includes forming source/drain epitaxy regions over the substrate. The source/drain epitaxy regions are disposed adjacent to the set of spacers, such that the dummy gate structure is disposed between the source/drain epitaxy regions. The method further includes removing the main spacers after forming the source/drain epitaxy regions. The method further includes replacing the dummy gate structure with a gate structure, where the replacing includes removing the dummy gate structure to form a trench defined by the spacers liners, such that the gate structure is formed in the trench. In some embodiments, the method further includes forming lightly doped source and drain (LDD) regions in the substrate, wherein the dummy gate structure is disposed between the LDD regions, and further wherein the set of spacers is formed after the LDD regions. In some embodiments, the method further includes forming an interlevel dielectric (ILD) layer over the substrate after removing the main spacers.

In some embodiments, forming the set of spacers includes conformally depositing a first spacer material layer over the dummy gate structure and the substrate, conformally depositing a second spacer material layer over the first spacer material layer, and etching the first spacer material layer and the second spacer material layer to respectively form the spacer liners and the main spacers. The second spacer material layer may be different than the first spacer material layer. In some embodiments, the method further includes forming a contact feature through the ILD layer, wherein the contact feature is connected with the source/drain epitaxy regions and the gate structure. In some embodiments, forming the source/drain epitaxy regions includes forming an interface between the source/drain epitaxy regions and the spacer liners. In some embodiments, the spacer liners are substantially L-shaped layers having substantially uniform thicknesses. In some embodiments, during the forming the set of spacers, the spacer liners are not etched before the main spacers are formed. In some embodiments, the method further includes forming a spacer material layer over the spacer liners and the source/drain epitaxy regions after removing the main spacers, and removing the spacer material layer before replacing the dummy gate structure.

Also described herein is an embodiment of a device, which includes a semiconductor substrate, a gate structure on the semiconductor substrate, and an epitaxy region disposed on the semiconductor substrate and adjacent the gate structure. The device further includes a spacer element abutting the gate structure and having at least one interface with the epitaxy region. An interlayer dielectric layer is disposed on the substrate and overlying the spacer element. In one embodiment of the device, the spacer element is SiCN.

In some embodiments, an exemplary integrated circuit device includes a gate structure disposed over a substrate; source/drain epitaxy regions disposed over the substrate, wherein gate structure is disposed between the source/drain epitaxy regions; spacer liners disposed along sidewalls of the gate structure, wherein the spacer liners include silicon and carbon, and further wherein the spacer liners share an interface with the source/drain epitaxy regions; and an interlayer dielectric (ILD) layer disposed over the substrate, wherein the ILD layer is disposed directly on the spacer liners. In some embodiments, the spacer liners have a thickness that is less than approximately 100 Angstroms. In some embodiments, the integrated circuit further includes lightly doped source/drain (LDD) regions disposed in the substrate, wherein the source/drain epitaxy regions are disposed on the LDD regions.

In some embodiments, the gate structure is a first gate structure, the source/drain epitaxy regions are first source/drain epitaxy regions, and the spacer liners are first spacer liners. In such embodiments, the integrated circuit device further includes a second gate structure disposed over a substrate; second source/drain epitaxy regions disposed over the substrate, wherein second gate structure is disposed between the second source/drain epitaxy regions; and second spacer liners disposed along sidewalls of the second gate structure, wherein the second spacer liners include silicon and carbon, and further wherein the second spacer liners share an interface with the second source/drain epitaxy regions. The ILD layer is also disposed directly on the second spacer liners. In such embodiments, the first gate structure and the first source/drain epitaxy regions are configured for an n-type device, and the second gate structure and the second source/drain epitaxy regions are configured for a p-type device.

What is claimed is:

1. An integrated circuit device comprising:
  a first gate stack and a second gate stack disposed over a substrate;
  a first silicon carbonitride (SiCN) spacer liner, a second SiCN spacer liner, a third SiCN spacer liner, and a fourth SiCN spacer liner, wherein the first SiCN spacer liner and the second SiCN spacer liner are disposed adjacent to respective sidewalls of the first gate stack and the third SiCN spacer liner and the fourth SiCN spacer liner are disposed adjacent to respective sidewalls of the second gate stack;
  a first source/drain epitaxy region, a second source/drain epitaxy region, a third source/drain epitaxy region, and a fourth source/drain epitaxy region disposed over the substrate, wherein the first gate stack is disposed between the first source/drain epitaxy region and the second source/drain epitaxy region, the second gate stack is disposed between the third source/drain epitaxy region and the fourth source/drain epitaxy region, the first source/drain epitaxy region and the second source/drain epitaxy region have a first profile, and the third source/drain epitaxy region and the fourth source/drain epitaxy region have a second profile;
  an interlayer dielectric (ILD) layer disposed over the substrate, the first gate stack, the second gate stack, the first SiCN spacer liner, the second SiCN spacer liner, the third SiCN spacer liner, the fourth SiCN spacer liner, the first source/drain epitaxy region, the second source/drain epitaxy region, the third source/drain epitaxy region, and the fourth source/drain epitaxy region;
  a shallow trench isolation structure disposed within the substrate between the second source/drain epitaxy region and the third source/drain epitaxy region;
  wherein the second SiCN spacer liner has a first surface, a second surface, and a third surface, wherein the first surface and the second surface extend substantially along a first direction, the first surface is opposite the second surface, the first surface shares a first interface with a respective sidewall of the first gate stack, the second surface shares a second interface with the ILD layer, and the third surface shares a third interface with the second source/drain epitaxy region;
  wherein the second SiCN spacer liner further has a fourth surface extending from the first surface to the second surface and a fifth surface extending orthogonally from the second surface away from the first gate stack to the third surface, wherein the second surface extends from the fourth surface to the fifth surface;
  wherein the third SiCN spacer liner has a sixth surface, a seventh surface, and an eighth surface, wherein the sixth surface and the seventh surface extend substantially along the first direction, the sixth surface is opposite the seventh surface, the sixth surface shares a fourth interface with a respective sidewall of the second gate stack, the seventh surface shares a fifth interface with the ILD layer, and the eighth surface shares a sixth interface with the third source/drain epitaxy region;
  wherein the third SiCN spacer liner further has a ninth surface extending from the sixth surface to the seventh surface and a tenth surface extending orthogonally from the seventh surface away from the second gate stack to the eighth surface, wherein the seventh surface extends from the ninth surface to the tenth surface;

wherein a top surface of the ILD layer, a top surface of the first gate stack, a top surface of the second gate stack, the fourth surface of the second SiCN spacer liner, and the ninth surface of the third SiCN spacer liner form a common surface;

wherein the ILD layer physically contacts an entirety of the second surface of the second SiCN spacer liner and an entirety of the seventh surface of the third SiCN spacer liner;

wherein a portion of the ILD layer extends continuously from the second surface of the second SiCN spacer liner over the second source/drain epitaxy region, the shallow trench isolation structure, and the third source/drain epitaxy region to physically contact the seventh surface of the third SiCN spacer liner; and wherein the portion of the ILD layer fills a first gap between a sidewall of the second source/drain epitaxy region and the second surface of the second SiCN spacer liner and a second gap between a sidewall of the third source/drain epitaxy region and the seventh surface of the third SiCN spacer liner, wherein a first aspect ratio of the first gap is different than a second aspect ratio of the second gap.

2. The integrated circuit device of claim 1, wherein a thickness of the first SiCN spacer liner, the second SiCN spacer liner, the third SiCN spacer liner, and the fourth SiCN spacer liner is greater than approximately 0 Angstroms and less than approximately 100 Angstroms.

3. The integrated circuit device of claim 1, wherein the first source/drain epitaxy region and the second source/drain epitaxy region include silicon and the third source/drain epitaxy region and the fourth source/drain epitaxy region include silicon and germanium.

4. The integrated circuit device of claim 1, further comprising first lightly doped source/drain (LDD) regions and second LDD regions disposed in the substrate, wherein:

the first source/drain epitaxy region and the second source/drain epitaxy region are disposed on the first LDD regions and the third source/drain epitaxy region and the fourth source/drain epitaxy region are disposed on the second LDD regions; and the second SiCN spacer liner further has an eleventh surface opposite the fifth surface and the third SiCN spacer liner has a twelfth surface opposite the tenth surface, wherein the eleventh surface extends orthogonally from the first surface away from the first gate stack and over a respective first LDD region, the twelfth surface extends orthogonally from the sixth surface away from the second gate stack and over a respective second LDD region, and the eleventh surface of the second SiCN spacer liner and the twelfth surface of the third SiCN spacer liner physically contact the respective first LDD region and the respective second LDD region, respectively.

5. The integrated circuit device of claim 4, wherein a top surface of the second source/drain epitaxy region is above the fifth surface of the second SiCN spacer liner and a top surface of the third source/drain epitaxy region is above the tenth surface.

6. The integrated circuit device of claim 1, further comprising source/drain contacts that extend through the ILD layer to the second source/drain epitaxy region and the third source/drain epitaxy region, respectively, wherein the source/drain contacts include metal silicide features.

7. The integrated circuit device of claim 1, wherein a bottom surface of the ILD layer is below a top surface of the second source/drain epitaxy region and a top surface of the third source/drain epitaxy region.

8. An integrated circuit device comprising:
a gate stack disposed over a substrate;
a first L-shaped spacer having a first surface disposed along a first sidewall of the gate stack and a second L-shaped spacer having a first surface disposed along a second sidewall of the gate stack, wherein the first L-shaped spacer and the second L-shaped spacer include silicon and carbon;
a shallow trench isolation structure disposed within the substrate;
a first source/drain epitaxy region and a second source/drain epitaxy region disposed over the substrate, wherein the gate stack is disposed between the first source/drain epitaxy region and the second source/drain epitaxy region, the first source/drain epitaxy region has a first top surface disposed between a second sidewall surface and a third sidewall surface, the second source/drain epitaxy region has a second top surface disposed between a fourth sidewall surface and a fifth sidewall surface, and the first source/drain epitaxy region and the second source/drain epitaxy region are semiconductor layers;
an interlayer dielectric (ILD) layer disposed over the substrate;
wherein a second surface of the first L-shaped spacer is opposite the first surface of the first L-shaped spacer and a second surface of the second L-shaped spacer is opposite the first surface of the second L-shaped spacer;
wherein a third surface of the first L-shaped spacer extends from the first surface of the first L-shaped spacer to the second surface of the first L-shaped spacer, a fourth surface of the first L-shaped spacer extends from the second surface of the first L-shaped spacer away from the gate stack to the second sidewall surface of the first source/drain epitaxy region, and the second surface of the first L-shaped spacer extends from the third surface of the first L-shaped spacer to the fourth surface of the first L-shaped spacer;
wherein a third surface of the second L-shaped spacer extends from the first surface of the second L-shaped spacer to the second surface of the second L-shaped spacer, a fourth surface of the second L-shaped spacer extends from the second surface of the second L-shaped spacer away from the gate stack to the fourth sidewall surface of the second source/drain epitaxy region, and the second surface of the second L-shaped spacer extends from the third surface of the second L-shaped spacer to the fourth surface of the second L-shaped spacer;
wherein a top surface of the gate stack, the third surface of the first L-shaped spacer, and the third surface of the second L-shaped spacer are free of the ILD layer;
wherein the first top surface of the first source/drain epitaxy region is higher than the fourth surface of the first L-shaped spacer and the second top surface of the second source/drain epitaxy region is higher than the fourth surface of the second L-shaped spacer;
wherein a first portion of the ILD layer physically contacts the first top surface, the second sidewall surface, and the third sidewall surface of the first source/drain epitaxy region, the first portion of the ILD layer extends from the second surface of the first L-shaped spacer to the second sidewall surface of the first source/drain epitaxy region, and the first portion of the ILD layer extends below the first top surface of the first source/drain epitaxy region and covers the fourth surface of the first L-shaped spacer;

wherein a second portion of the ILD layer physically contacts the second top surface, the fourth sidewall surface, and the fifth sidewall surface of the second source/drain epitaxy region, the second portion of the ILD layer extends from the second surface of the second L-shaped spacer to the fourth sidewall surface of the second source/drain epitaxy region, and the second portion of the ILD layer extends below the second top surface of the second source/drain epitaxy region and covers the fourth surface of the second L-shaped spacer;

wherein the ILD layer directly contacts an entirety of the second surface of the first L-shaped spacer, an entirety of the second surface of the second L-shaped spacer, an entirety of the fourth surface of the first L-shaped spacer, and an entirety of the fourth surface of the second L-shaped spacer; and wherein the ILD layer extends continuously from the shallow trench isolation structure to physically contact the second surface of the first L-shaped spacer.

9. The integrated circuit device of claim 8, further comprising a first lightly doped source and drain (LDD) region and a second LDD region disposed in the substrate, wherein the gate stack is disposed between the first LDD region and the second LDD region.

10. The integrated circuit device of claim 9, wherein the first L-shaped spacer is disposed directly on a portion of the first LDD region and the second L-shaped spacer is disposed directly on a portion of the second LDD region.

11. The integrated circuit device of claim 8, wherein the first L-shaped spacer and the second L-shaped spacer further include nitrogen.

12. The integrated circuit device of claim 8, wherein:
a first portion of the ILD layer that directly contacts the entirety of the fourth surface of the first L-shaped spacer is not connected to a second portion of the ILD layer that directly contacts the entirety of the fourth surface of the second L-shaped spacer.

13. The integrated circuit device of claim 8, further comprising:
a first contact and a second contact that extend through the ILD layer respectively to the first source/drain epitaxy region and the second source/drain epitaxy region; and
a third contact to the gate stack.

14. The integrated circuit device of claim 8, wherein the first L-shaped spacer and the second L-shaped spacer each include a substantially uniform thickness.

15. The integrated circuit device of claim 8, wherein a height of a top surface of the ILD layer relative to a top surface of the substrate is about equal to a height of the top surface of the gate stack relative to the top surface of the substrate.

16. An integrated circuit device comprising:
a first high-k/metal gate stack disposed between first raised source/drain epitaxy features, wherein the first high-k/metal gate stack and the first raised source/drain epitaxy features are disposed over a substrate;
a second high-k/metal gate stack disposed between second raised source/drain epitaxy features, wherein the second high-k/metal gate stack and the second raised source/drain epitaxy features are disposed over the substrate;
a shallow trench isolation structure disposed within the substrate;

first L-shaped spacer liners disposed along sidewalls of the first high-k/metal gate stack and second L-shaped spacer liners disposed along sidewalls of the second high-k/metal gate stack, wherein each of the first L-shaped spacer liners and the second L-shaped spacer liners has a first sidewall surface interfacing with a respective sidewall of the first high-k/metal gate stack or the second high-k/metal gate stack, a second sidewall surface that opposes the first sidewall surface and extends to a same height as the first sidewall surface, a first top surface extending from the first sidewall surface to the second sidewall surface, a second top surface extending orthogonally from the second sidewall surface to a respective one of the first raised source/drain epitaxy features or the second raised source/drain epitaxy features, and a third sidewall surface extending from the second top surface to the substrate, wherein the second sidewall surface extends from the first top surface to the second top surface;

a dielectric layer disposed over the substrate, wherein the dielectric layer directly contacts the first raised source/drain epitaxy features, the second raised source/drain epitaxy features, the first L-shaped spacer liners, the second L-shaped spacer liners, and the shallow trench isolation structure, wherein the first top surfaces of the first L-shaped spacer liners and the second L-shaped spacer liners are free of the dielectric layer and the dielectric layer covers an entirety of the second sidewall surfaces of the first L-shaped spacer liners and the second L-shaped spacer liners and an entirety of the second top surfaces of the first L-shaped spacer liners and the second L-shaped spacer liners;

wherein first portions of the dielectric layer fill first gaps between the first L-shaped spacer liners and the first raised source/drain epitaxy features;

wherein second portions of the dielectric layer fill second gaps between the second L-shaped spacer liners and the second raised source/drain epitaxy features;

wherein the first have a first depth and a first width, the first depth is between top surfaces of the first raised source/drain epitaxy features and the second top surfaces horizontal portions of the first L-shaped spacer liners, and the first width is between sidewall surfaces of the first raised source/drain epitaxy features and the second sidewall surfaces of the first L-shaped spacer liners;

wherein the second gaps have a second depth and a second width, the second depth is between top surfaces of the second raised source/drain epitaxy features and the second top surfaces of the second L-shaped spacer liners, and the second width is between sidewall surfaces of the second raised source/drain epitaxy features and the second sidewall surfaces of the second L-shaped spacer liners; and wherein a first ratio of the first depth to the first width of the first gaps is different than a second ratio of the second depth to the second width of the second gaps.

17. The integrated circuit device of claim 16, wherein each of the first L-shaped spacer liners and the second L-shaped spacer liners has a bottom surface that opposes the second top surface, and the bottom surface extends from the first sidewall surface to a respective one of the first raised source/drain epitaxy features or the second raised source/drain epitaxy features.

18. The integrated circuit device of claim 16, wherein the first raised source/drain epitaxy features cover entireties of the third sidewall surfaces of the first L-shaped spacer liners.

19. The integrated circuit device of claim 16, wherein the first L-shaped spacer liners and the second L-shaped spacer liners includes silicon, carbon, and nitrogen.

20. The integrated circuit device of claim 16, wherein the first high-k/metal gate stack and the first raised source/drain epitaxy features are a portion of a p-type transistor and the second high-k/metal gate stack and the second raised source/drain epitaxy features are a portion of an n-type transistor.

* * * * *